US011456259B2

(12) United States Patent
Sen

(10) Patent No.: US 11,456,259 B2
(45) Date of Patent: Sep. 27, 2022

(54) PANEL LEVEL PACKAGING FOR DEVICES

(71) Applicant: PYXIS CF PTE. LTD., Singapore (SG)

(72) Inventor: Amlan Sen, Singapore (SG)

(73) Assignee: PYXIS CF PTE. LTD., Singapore (SG)

( * ) Notice: Subject to any disclaimer, the term of this patent is extended or adjusted under 35 U.S.C. 154(b) by 0 days.

(21) Appl. No.: 16/814,961

(22) Filed: Mar. 10, 2020

(65) Prior Publication Data

US 2020/0312780 A1   Oct. 1, 2020

(30) Foreign Application Priority Data

Mar. 27, 2019 (SG) .......................... 10201902757X

(51) Int. Cl.
| | | |
|---|---|---|
| *H01L 23/544* | (2006.01) | |
| *H01L 21/67* | (2006.01) | |
| *H01L 21/68* | (2006.01) | |
| *H01L 21/48* | (2006.01) | |
| *H01L 21/66* | (2006.01) | |
| *H01L 23/498* | (2006.01) | |

(52) U.S. Cl.
CPC ........ *H01L 23/544* (2013.01); *H01L 21/4853* (2013.01); *H01L 21/67144* (2013.01); *H01L 21/681* (2013.01); *H01L 22/20* (2013.01); *H01L 23/49838* (2013.01); *H01L 2223/54426* (2013.01)

(58) Field of Classification Search
CPC ............. H01L 23/544; H01L 21/67144; H01L 21/681; H01L 21/4853; H01L 22/20; H01L 23/49838; H01L 2223/54426; H01L 2221/68318; H01L 21/67242; H01L 21/6836; H01L 23/5389; H01L 2221/68381; H01L 2221/68309; H01L 21/6835; H01L 21/568; H01L 24/75; H01L 21/50; H01L 2221/68327
USPC .......................................................... 438/5
See application file for complete search history.

(56) References Cited

U.S. PATENT DOCUMENTS

| | | | | |
|---|---|---|---|---|
| 7,013,559 B2* | 3/2006 | Rumsey | .................. | H01L 24/49 29/840 |
| 7,642,662 B2* | 1/2010 | Kasuga | .................. | H05K 3/303 257/797 |

(Continued)

FOREIGN PATENT DOCUMENTS

| | | |
|---|---|---|
| TW | 201814819 A | 4/2018 |
| WO | 2017/169953 A1 | 10/2017 |

*Primary Examiner* — Vu A Vu
(74) *Attorney, Agent, or Firm* — Javalon Law, PC

(57) ABSTRACT

Panel level packaging (PLP) with high accuracy and high scalability is disclosed. The PLP employs an alignment carrier with a low coefficient of expansion which is configured with die regions having local die alignment marks. For example, local die alignment marks are provided for each die attach region. Depending on the size of the panel, it may be segmented into blocks, each with die regions with local die alignment marks. In addition, a block includes an alignment die region configured for attaching an alignment die. Linear and non-linear positional errors are reduced due to local die alignment marks and alignment dies. The use of local die alignment marks and alignment dies results in increase yields as well as scaling, thereby improving throughput and decreasing overall costs.

20 Claims, 38 Drawing Sheets

(56) References Cited

U.S. PATENT DOCUMENTS

| | | | |
|---|---|---|---|
| 8,810,698 B2* | 8/2014 | Hiramoto | H01L 27/14627 |
| | | | 348/294 |
| 9,704,822 B2* | 7/2017 | Knickerbocker | H01L 24/94 |
| 10,745,796 B2* | 8/2020 | Bucci | C23C 14/042 |
| 2017/0133345 A1 | 5/2017 | Knickerbocker et al. | |
| 2017/0179096 A1* | 6/2017 | Dang | H01L 24/32 |
| 2019/0304852 A1* | 10/2019 | Seyama | H01L 22/12 |

* cited by examiner

|  | Actual Distance | Distance in Air |
|---|---|---|
| Lens to Prism |  | 12.5 |
| Prism surface to Mirror surface | Distance Thru Glass | 6.58 |
| Mirror surface to Prism surface | Distance Thru Glass | 6.58 |
| Prism surface to Prism surface |  | 12 |
| Prism surface to Mirror surface | Distance Thru Glass | 6.58 |
| Mirror surface to Prism surface | Distance Thru Glass | 6.58 |
| Prism Surface to Ring Glass |  | 7 |
| Glass Surface to Glass Surface | Distance Thru Glass | 0.1316 |
| Prism Surface to Work Piece |  | 7 |
|  | 78.7 | 64.9516 |

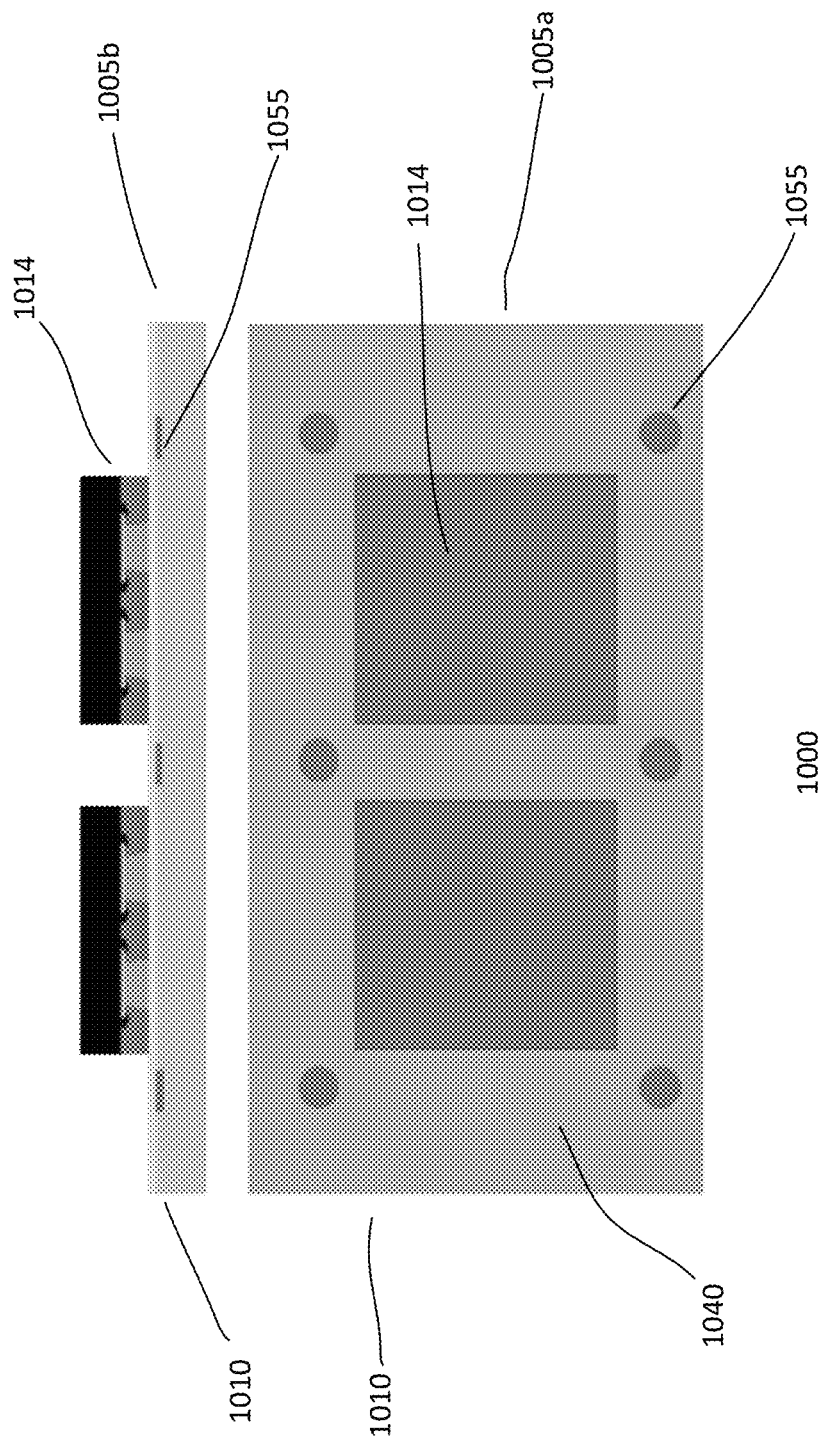

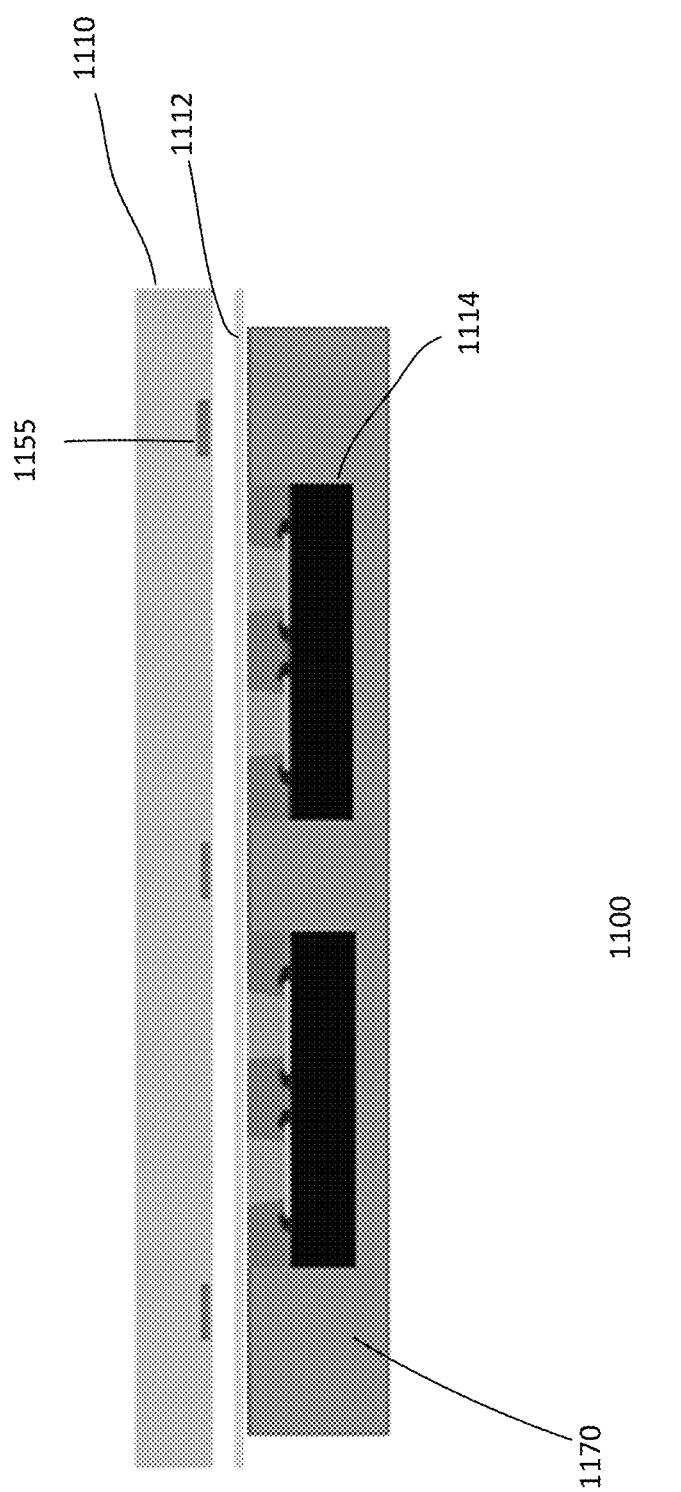

Fig. 12d

PANEL LEVEL PACKAGING FOR DEVICES

CROSS-REFERENCE TO RELATED APPLICATIONS

This application claims the benefit of S.G. Provisional Application No. 10201902757X filed on Mar. 27, 2019, the disclosure of which is herein incorporated by reference in their entireties for all purposes.

FIELD OF THE INVENTION

The present disclosure relates to packaging of devices. In particular, the present disclosure relates to alignment carriers and an alignment system having a camera module configured for aligning dies or devices on the alignment carrier for die bonding.

BACKGROUND

Panel level packaging (PLP) of devices have garnered significant interest in recent years. This is due to the larger volume of dies which can be packaged in parallel compared to conventional wafer level or substrate level packaging techniques. PLP involves attaching individual dies on a large carrier for die bonding. For example, the dies are arranged in a matrix on the carrier, with rows and columns of dies. The panel, depending on its size, can accommodate significantly more dies than on a wafer, for example, 3 times to 5 times or more dies than a wafer. This increases packaging throughput as well as reducing costs.

An important consideration in PLP is the precise positioning of the die on the panel prior to bonding at a target location. Conventionally, bonding locations are calculated based on global reference marks on the panel and each die is placed in a predetermined position by precise mechanical movement of a bonding head.

However, conventional PLP techniques suffer from positioning errors on the carrier. Positioning errors may occur due to various reasons, such as geometry related issues (e.g., straightness, linearity, and orthogonality), temperature issues (e.g., expansion of scales, slides, and distortion) and vibration issues (e.g., high-speed motion over long distances may result in stopping position errors). In addition, during the reconstruction or reconstitution process, the carrier and panel (dies with molding) undergo thermal cycles of expansion and contraction. Additional thermal cycles may be experienced due to reuse of the carriers.

Panel distortion causes geometry or size to vary from the original design from which the die locations are calculated. The more thermal cycles experienced, the greater the distortion. The distortion problem is further exacerbated as the panel size increases. Distortion causes displacement of dies on the panel from the original calculated locations. Displacement of dies negatively affects the yield of the bonding process, increasing costs. The greater the distortion, the greater the displacement. The greater the displacement, the greater the negative effects on yields and costs. Due to the displacement errors, subsequent processes involve significant error mitigation to construct the circuits more accurately From the foregoing discussion, it is desirable to provide PLP with high accuracy throughout the bonding process to increase yields as well as to improve scalability.

SUMMARY

Embodiments of the present disclosure generally relate to devices. In particular, the present disclosure relates to die bonding using an alignment carrier. The alignment carrier may be employed for die bonding of single die packages or multiple die packages, such as multi-chip modules (MCMs). The die bonding is facilitated by a die bonding tool with a camera or an alignment module configured to align dies for bonding onto the alignment carrier.

In one embodiment, a device includes an alignment carrier for die bonding which includes a planar carrier and die bond regions defined on the planar carrier. Each die bond region of the planar carrier includes local alignment marks for use in die bonding.

In one embodiment, an alignment system for a die bonder includes an integrated camera module configured to view downward in a vertical direction for detecting local alignment marks of a die bond region of interest of an alignment carrier with die bond regions having local alignment marks when the alignment carrier is mounted on a base assembly of the die bonder. The integrated camera module is further configured to view upwards in the vertical direction for viewing a bottom surface of a die when attached to a bond head of the die bonder for die bonding. The system further includes an alignment controller for receiving input from the camera module, the alignment controller is configured to align the die when attached to the bond head to the die bond region of interest for die bonding based on the input from the camera module.

In one embodiment, a method for die bonding includes providing an alignment carrier including die bond regions defined thereon. The die bond regions include local alignment marks to facilitate aligning dies for die bonding of the dies to the die bond regions and the alignment carrier is mounted onto a base assembly of a die bonder. The method further includes picking up a first die for die bonding onto a first die bond region on the alignment carrier by a bond head of the die bonder and aligning the first die to the first die bond region using an alignment system. The alignment system is configured to view downward in a vertical direction for detecting local alignment marks of the first die bond region, and to view upwards in the vertical direction for viewing a bottom surface of the first die. The method further includes sending information of the alignment system to a controller which aligns the first die to the first die bond region based on the information from the alignment system. The method continues to include moving the first die downwards vertically by the bond head to the alignment carrier after alignment of the first die to the first die bond region is achieved to bond the first die on the first die bond region of the alignment carrier.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with thy: description, serve to explain the principles of various embodiments of the present disclosure.

FIG. 5c shows an exemplary distance configurations of components of the camera unit;

FIGS. 10a-d show an embodiment of an alignment process in greater detail;

FIGS. 11a-f show simplified cross-sectional views of an embodiment of a reconstruction process of dies using an alignment carrier;

FIG. 12d shows an example of a DLC export file;

DETAILED DESCRIPTION

Embodiments generally relate to devices, for example, semiconductor devices or integrated circuits (ICs). In particular, the present disclosure relates to die bonding of devices using an alignment carrier. The alignment carrier may be employed for die bonding of single die packages or multiple die packages, such as multi-chip modules (MCMs). The die bonding is facilitated by a die bonding tool with a camera or an alignment module configured to align dies for bonding onto the alignment carrier.

Figure 1:
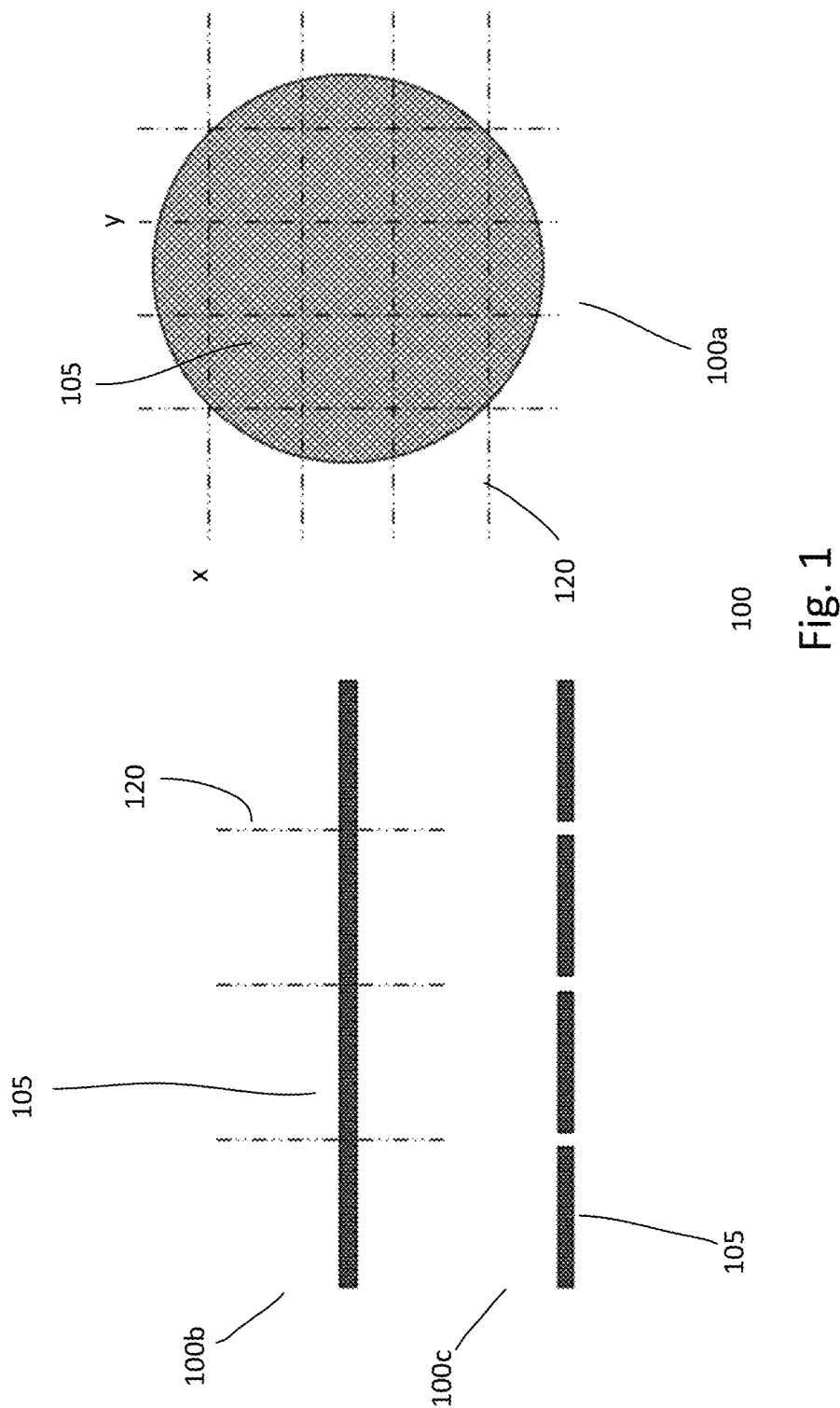
FIG. 1 shows various views of a semiconductor wafer.

FIG. 1 shows simplified views of a semiconductor wafer 100. For example, a top view 100a and side views 100b-c of the wafer are shown. The wafer may be a lightly doped p-type silicon wafer. Other types of wafers may also be employed. A plurality of devices 105 are formed on an active surface of the wafer. For example, the active surface may be the top surface of the wafer while the inactive surface may be the bottom surface. The devices are arranged in rows along a first (x) direction and columns along a second (y) direction. After processing of the wafer is completed, the wafer is diced along the dicing lines 120 in the x and y directions to singulate the devices into individual dies 105, as indicated by the side view 100c.

Processed wafers may be incoming processed wafers from an external supplier. For example, a packaging vendor may receive the processed wafers. The processed wafers may be diced into individual dies for packaging using alignment carriers and die bonding tools fitted with alignment modules to align dies for die bonding onto the alignment carriers.

Figure 2:
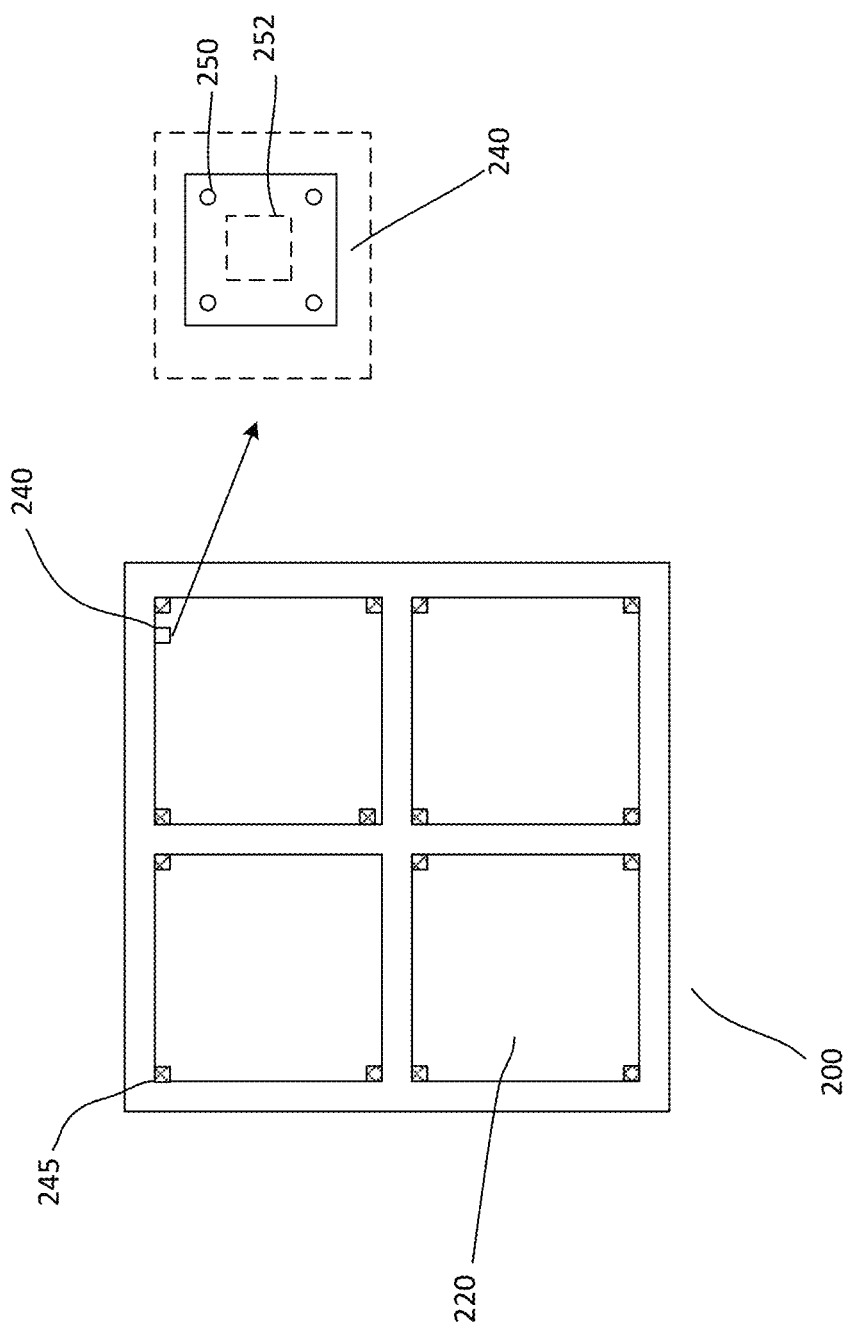
FIG. 2 shows a simplified top view of an embodiment of an alignment carrier for die bonding.

FIG. 2 shows a simplified top view of an embodiment of an alignment carrier 200. The alignment carrier is configured for die bonding, such as attaching dies thereto. As shown, the alignment carrier is a rectangular-shaped carrier. Other shaped carriers may also be useful. In a preferred embodiment, the panel is formed of a material having a low coefficient of expansion (CTE) to minimize linear variation during temperature changes. The panel, for example, may be formed of a material having a CTE at or below 8. Furthermore, the material should be robust enough to withstand the handling during the bonding process. In addition, the material should preferably be magnetic, enabling the panel to be held firmly during grinding processes which are part of the overall bonding process. For example, the low CTE material may include, for example, Alloy 42 (CTE3-4.5) and Alloy 46 (CTE7-8). Other types of low CTE materials may also be used to form the alignment carrier. Forming the alignment carrier using other materials as well as materials with other CTEs, including those having a CTE above 8 may also be useful. The size of the alignment carrier may be as large as 600*600 mm. Providing alignment carriers having other sizes may also be useful.

The alignment carrier, in one embodiment, includes die bonding regions 240. A die bonding region is configured to accommodate a die for die bonding. For example, each die bonding region of the alignment carrier is configured to accommodate a die for die bonding. In one embodiment, a die bonding region includes local alignment marks 250 for aligning a die to a die attach region 252. For example, each die region includes its own local die alignment marks for attaching a die thereto. The die attach region is the region of the die bond region on which the die is attached.

In one embodiment, a die bond region includes at least two local die alignment marks. Providing other numbers of local die alignment marks greater than two may also be useful. For example, the die region may include 2-4 alignment marks. Providing other numbers of alignment marks, including more than four alignment marks may also be useful. As shown, the die region includes 4 local die alignment marks. The local die alignment marks, for example, are located on the corners of the die bond region, forming corners of a rectangle. Other configurations of the local die alignment marks may also be useful.

The alignment marks, in one embodiment, are preferably located outside of the die attach region. For example, the alignment marks, as shown, surround the die attach region. Providing alignment marks which are within the die attach region or a combination of alignment marks outside and within the die attach region may also be useful. Providing the alignment marks outside of the die attach region advantageously facilities post bonding inspection, if necessary. The die bond region may be configured to accommodate a single die or multiple dies, such as a multi-chip module (MCM) application. In the case of an MCM application, providing alignment marks outside the die attach region advantageously enables an alignment mark to serve as a common alignment mark for bonding multiple dies onto the die bond region. If alignment marks are disposed within the die attach region of one of the dies, additional alignment marks may be provided for die bonding of other dies of the MCM.

In one embodiment, the local die alignment marks are configured for detection by a collinear vision camera for alignment. The local die alignment marks may be formed on the die bond regions of the alignment carrier using, for example, laser drilling. Other techniques for forming the local die alignment marks may also be useful. Preferably, the local die alignment marks are shallow alignment marks which facilitate removal by grinding for recycling of the panel. For example, local alignment marks may be removed and new ones are formed for die bonding of another or different type of die, such as when a die is no longer in production.

Providing local die alignment marks for each die bond region improves the positional accuracy of die bonding for each die bond region, as compared to calculating die bond positions based on global alignment marks, as is conventionally done. Furthermore, by providing local die alignment marks, effects of panel distortion or other positioning errors are minimized, improving positional accuracy of dies on the alignment carrier, thereby improving yield and scalability.

The die bond regions of the alignment carrier may be configured in a matrix format, with rows and columns of die bond regions in first and second directions. For example, the die bond regions 240 are arranged in a matrix format, each configured to accommodate a die. The alignment carrier may include at least two designated alignment die bond regions 245. For example, the alignment carrier may include 2-4 alignment die bond regions. Providing other numbers of alignment die bond regions may also be useful. The alignment die bond regions may be located at corners of the matrix of die bond regions. Other configurations of alignment die bond regions may also be employed.

An alignment die region is similar to other die regions of the panel, except that an alignment die bond region is designated for an alignment die. For example, an alignment die is die bonded to an alignment die bond region. An alignment die may be a normal or live die, such as dies bonded in the other die bond regions of the carrier. Live or normal dies are packaged and sold to customers and into products. For example, an alignment die may be a live die which is also used for alignment purposes.

In other cases, an alignment die may be specifically configured for alignment purposes. Providing specific alignment dies may be advantageous as they can be easily distinguished from normal or live dies. In such cases, alignment dies are not for normal use. Preferably, the top of an alignment die is processed with features which are easily detectable by the alignment camera. This produces contrast in the alignment image, making it easy to detect. Other types of alignment dies are also useful. Alignment dies may be processed on the same wafer as the normal dies or on different wafers.

In one embodiment, the alignment carrier may be divided or segmented into die bond region blocks 220. The blocks, for example, are distinct blocks, with a space separating adjacent blocks. In some embodiments, the blocks may not be distinct blocks. For example, the die bond regions may be divided into blocks which are not separated by spaces. For example, the blocks may appear to be a continuous matrix of die bond regions.

A block is configured to accommodate a plurality of dies for die bonding. Segmenting the panel into blocks is advantageous as this segments the panel into smaller dimension blocks to reduce displacement errors caused by large panels. For example, the blocks provide a large panel with the advantage of scale while retaining the advantages from smaller sized panels. As shown, the panel is divided into 4 panel blocks. Dividing the panel into other numbers of blocks may also be useful. For a 600*600 mm alignment carrier, the blocks may be about 270*270 mm. Preferably, the blocks are configured to be the same size blocks. Other numbers of blocks and block sizes may also be useful. The number of blocks and block sizes may depend on different factors, such as material, size of the panel, and process conditions. The size of the block should be selected to effect high processing yields while maintaining the advantage of scale.

A block, in one embodiment, includes at least one alignment die bond region 245 for bonding an alignment die thereto. Providing more than one alignment die bond regions may also be useful. For example, a block may include 1-4 or more alignment die regions. An alignment die bond region may preferably be disposed at a corner position of the block. For example, alignment die bond regions may be disposed at the 4 corners of the block or 1-3 corners of the blocks. Locating alignment die bond regions at other positions of the block may also be useful. The more alignment die regions there are, the more accurate the die bonding process. However, it may be at the cost of a lower number of die outputs per alignment carrier, in the case where alignment dies are specifically for alignment purposes, since more die regions are assigned to alignment dies. In some embodiments, adjacent blocks may share alignment die bond regions. For example, in the case where a block is provided with one alignment die bond region, it can share a second alignment die region from an adjacent block. Other configurations of sharing alignment die regions between blocks may also be useful.

An alignment die serves as a further reference point for each block. Providing blocks with alignment dies enables linear and non-linear errors occurring in downstream processes, such as molding, to be reduced to fractions. For example, linear and non-linear positioning errors are reduced significantly. In addition, the alignment die serves as an origin reference for each die within a block.

As described, the alignment carrier is formed of a metallic material with local alignment marks. The use of a metallic material is advantageous as it allows a magnetic table to be used to hold the carrier firmly in place for processing. For example, a magnetic table may be employed to firmly hold the carrier in place for grinding the mold compound.

In other embodiments, the alignment carrier may be formed of glass or other types of transparent material. The local alignment marks may be formed on the transparent carrier. In other cases, the local alignment marks may be independent of a transparent carrier, such as a glass carrier. For example, local alignment marks may be formed on a separate mark sheet, such as paper or resin, and may be attached to the bottom or inactive surface of the transparent carrier. The adoption of the independent local marks eliminates the need for the marking process on the panel, and thus reduces manufacturing cost significantly Light from a camera module of a die bonder can penetrate through the transparent carrier to detect the local alignment marks on the mark sheet. The adoption of the independent local marks can be achieved easily and eliminates the need for the marking process on the carrier. Furthermore, providing local alignment marks independent of a transparent carrier is advantageous since it avoids the need to mass-produce glass panels with local alignment marks. This can result in significant savings since glass panels are fragile and the marking process is expensive.

Figure 3:
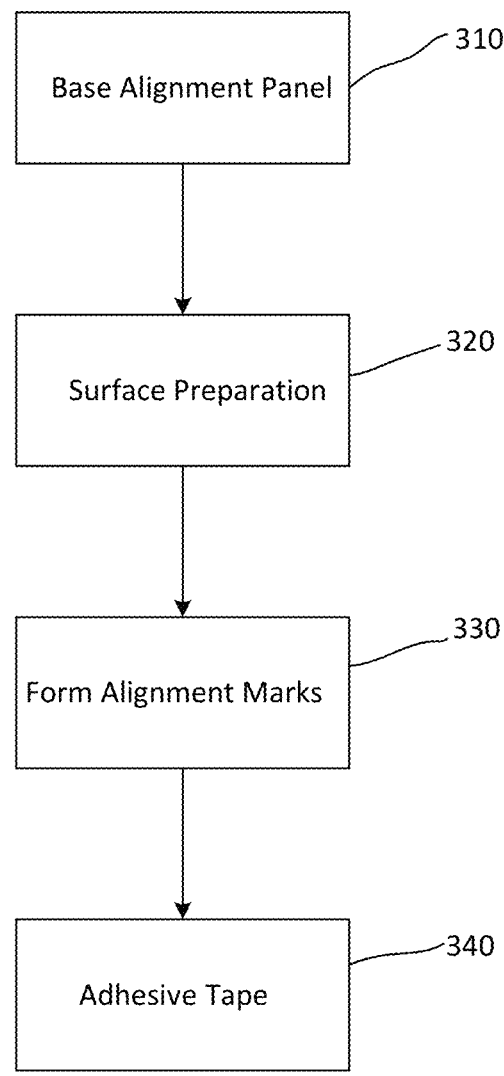
FIG. 3 shows an embodiment of a process flow for preparing an alignment carrier for die bonding.

FIG. 3 shows an embodiment of a process 300 for preparing an alignment carrier for die bonding. At 310, a base alignment carrier is provided. As discussed, the base alignment carrier may be a low CTE alignment carrier. For example, the alignment carrier may be formed of Alloy 42 (CTE3-4.5) or Alloy 46 (CTE7-8). Other types of low CTE materials may also be used to form the alignment carrier. At 320, the surface of the panel is prepared. For example, the bonding or active surface of the alignment carrier is prepared. In one embodiment, the surface preparation includes grinding to ensure flatness and thickness uniformity as well as a scratch-free surface. In some cases, the active surface may be treated to further harden the surface to prevent it from being scratched as well as from being discolored. As for the non-bonding or inactive surface, it may be grounded to ensure that it is free of dents and burrs.

Proceeding to 330, the process continues to form alignment marks on the active surface of the panel. The alignment marks are formed with high precision to get an accurate pitch from mark to mark. For example, alignment marks are formed in virtual die regions on the active surface of the panel. The die regions may be configured into separate virtual blocks. The pattern of the marks may be based on the panel layout of a panel computer-aided design (CAD) file. The alignment marks, for example, may be formed using laser, mechanical drilling or etching. Other techniques for forming the marks may also be useful.

After the alignment marks are formed, an adhesive tape is applied on the active surface of the alignment carrier at 340. The tape is applied on the active surface of the alignment carrier in preparation for die bonding. For example, the tape covers the active surface, including the local alignment marks and die regions. The tape, in one embodiment, is a thermal release tape. Other types of tapes may also be used to facilitate die bonding. The tape should be sufficiently transparent to enable an alignment unit of a bond module with cameras to detect the alignment marks for aligning the die to the alignment carrier. For example, the tape may be semi-transparent to enable the light of the alignment unit to penetrate through the tape to detect the local alignment marks. In one embodiment, the cameras of the alignment unit are configured to image the alignment marks on the alignment carrier vertically downwards as well as upwards to image the bonding surface of the die for accurate bonding of the die to the die bonding region of the alignment carrier. In addition, the stickiness of the tape should be strong enough to hold the dies in position once aligned and placed thereon by a bonding tool. After applying the tape, the alignment carrier is ready for die bonding.

Figure 4:
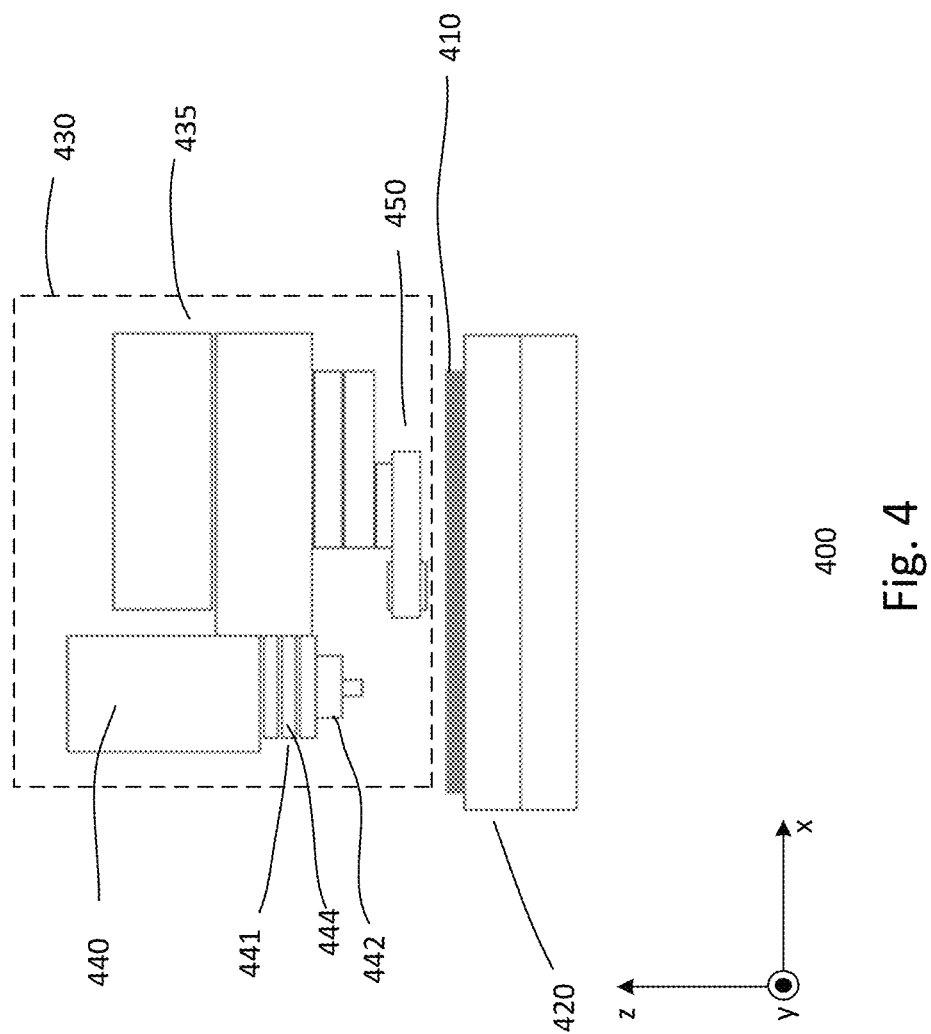
FIG. 4 shows a simplified side view of an embodiment of a bonding tool.

FIG. 4 shows a simplified diagram of an embodiment of a die bonder 400. As shown, the die bonder includes a base assembly 420 for supporting an alignment carrier 410. For example, the base assembly is configured to hold an alignment carrier 410 for bonding. The die bonder includes a bonding assembly 430 mounted on a support or gantry assembly 435. The bonding assembly, for example, is positioned above the base assembly. The bonding assembly includes a bonding head 441 and a bonding assembly actuator 440. The bonding assembly actuator is configured to move the bonding head in a z-direction (vertical direction) towards or away from the alignment carrier. The bonding head includes a bonding head actuator 444 and a bonding tool (bonder) 442. The bonding head actuator controls the bonder to pick up or release a die.

The support or gantry assembly is configured for actuating the bonding assembly to position the bonding head at successive die bonding regions on the alignment carrier. For example, the support assembly includes a support alignment assembly which is configured to align the bonding head in an x-y plane for positioning the bonding head at successive die bonding regions for die bonding. For example, the support alignment assembly may perform coarse alignment of the bonding head to the die bonding region for die bonding. After the coarse alignment, the support alignment assembly performs fine alignment of the bonding head to bond the die to the die attach region. Coarse alignment may include moving the bonding head in the x and/or y directions to the die bonding region while fine alignment may include moving the bonding head in the x and/or y directions as well as rotating the die along the x-y plane by the die bonding tool.

In one embodiment, the support alignment assembly includes an x-axis actuator, a y-axis actuator, and an angular (θ) actuator for performing the planar motion along the horizontal x-y plane and/or angular motion about an axis of the bonding head to facilitate course and fine alignments. The coarse and fine alignment may be performed continuously or discontinuously. For example, continuous coarse and fine alignments may be in the case when they are both performed after picking up a die by the bonding head from a feeder assembly (not shown); discontinuous coarse and fine alignment may be when course alignment is performed prior to picking up the die by the bonding head and fine alignment is performed afterwards.

To facilitate alignment of the die to the die bonding region, the bonding assembly includes an integrated camera module 450. For example, the camera unit extends to image the die region on the alignment carrier and the die on the bonder 442 of the bonding head 441. Coarse alignment may be performed with the use of the camera module or without. For example, positions of the die bonding regions may be roughly or coarsely determined based on an alignment die bonding region or position. Alternatively, coarse alignment may be determined by using the camera module. As for fine alignment, it is facilitated by the camera module.

The camera unit includes cameras and light sources for emitting light for image capturing. The light sources, for example, are capable of emitting light that can penetrate through the adhesive layer on the panel to identify local die alignment marks by the camera module to align a die to the die attach region of the die bonding region by moving the bond head. For example, the light source or sources may generate light having a wavelength of about 600 nm to penetrate the adhesive tape. Other wavelengths which may penetrate the adhesive tape may also be useful. In one embodiment, the camera module includes a lookdown camera for viewing the alignment carrier.

The light also enables the camera module to view the die on the bonding head, enabling alignment of the die to the die attach region by rotating the die in the x-y plane. For example, the camera captures the image of the target location as well as an image of the die. In one embodiment, the camera module includes a lookup camera for viewing the die panel. A die bonder controller computes the offset values with respect to the target location in the x and y directions as well as the angle in the x-y plane. Once calculated, the controller adjusts the bonding head accordingly for placement of the die on the target die attach region.

The present system can accommodate attaching a die on the die carrier using the active or non-active surface. For example, the die can be attached to the alignment carrier in a face-up or face-down configuration. Face up, for example, refers to the inactive surface of the die being attached to the alignment carrier while face down refers to the active surface of the die being attached to the alignment carrier. For face-down configurations, a transparent layer, such as ABF, may be applied on the active surface of the die. This enables the camera module to further utilize features on the die to serve as alignment features. For example, the lookup camera may view the features of the active surface of the die to serve as alignment marks. In some cases, an inactive surface of the die may be processed to include alignment features for the lookup camera to detect. By using the lookup camera, the die bonder can improve accuracy by adopting a cluster of multiple features on the bottom or bonding surface of the die.

As discussed, the die bonder is configured with one bonding assembly with a die bonding head. To increase throughput, the die bonder may be configured with multiple die bonding assemblies mounted onto a support assembly. For example, the die bonder may be configured with 4 or 6 bonding assemblies for die bonding multiple dies in parallel on an alignment carrier. In some cases, multiple alignment carriers may be die bonded in parallel using multiple bonding assemblies. The individual bonding assemblies may be configured to operate independently of each other. For example, each bonding assembly includes its respective support assembly and camera module for independent alignment of the die to the die attach region.

Also as described, the support alignment assembly performs both coarse and fine alignments. In some embodiments, the base assembly may include a translatable table for performing coarse alignment of the carrier while the support alignment assembly performs fine alignment. Other configurations of aligning the bonding head to the bonding region on the alignment carrier may also be employed.

Figure 5A:
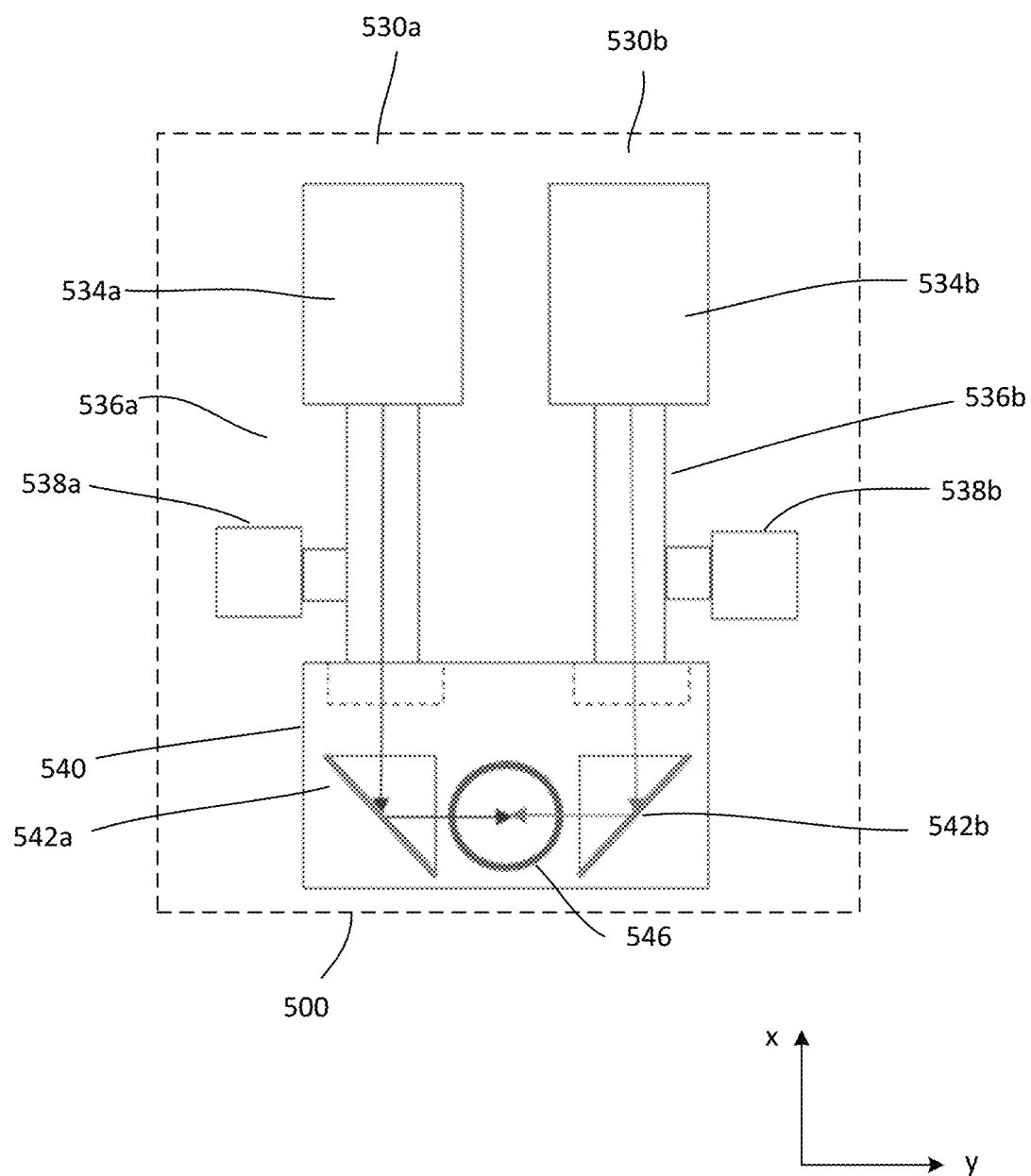
FIGS. 5a-b show simplified top and side views of an embodiment of a camera unit of the bonding tool.
Figure 5B:
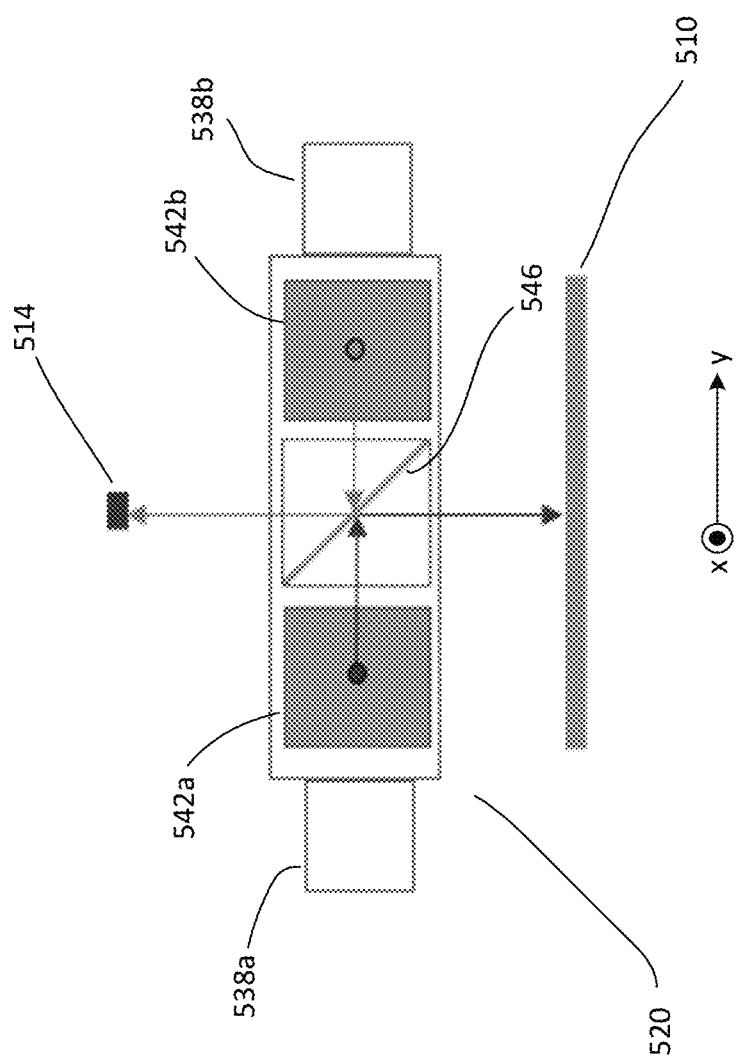

FIGS. 5a-b show different simplified views of a camera unit 500. For example, FIG. 5a shows a top view of the camera unit while FIG. 5b shows a side view of the camera unit. The side view of the camera unit shown in FIG. 5b, for example, may be viewed from the front or from the x direction.

Referring to the FIGS. 5a-b, the camera unit includes first and second integrated alignment camera subunits 530a-530b. The integrated camera subunits are high resolution collinear camera subunits, one for viewing the alignment carrier 510 and the other for viewing the die 514. For example, the first camera subunit (lookdown) 530a is configured to view or image the alignment carrier while the second camera subunit (lookup) 530b is configured to view or image the die in an optical deflector subunit 540. As shown, the camera subunits are disposed side-by-side in the x-y plane. An integrated camera subunit includes a collinear camera (534a or 534b) coupled to a high-resolution lens (536a or 536b). A light source (538a or 538b) is configured to emit light capable of penetrating the adhesive tape covering the alignment marks on the panel. For example, the light source may generate light at a wavelength of 600 nm. Other wavelengths which are sufficient to penetrate the adhesive tape or transparent dielectric layer may also be useful.

The light is passed to the reflector subunit 540. The reflector subunit is configured to reflect light from the first light source 538a via a first reflector or mirror 542a to a prism 546 which further reflects the light from the first light source downwards to the panel (lookdown camera), while the light from the second light source 538b is reflected from the second reflector or mirror 542b to the prism 546 and further upwards to the die (lookup camera). This enables the camera unit to capture images from both the die and die attach region on the carrier, giving it a direct line of sight for alignment.

As discussed, the camera module utilizes simultaneous recognition of the die and local alignment marks on the alignment carrier using lookup and lookdown cameras. The ability to simultaneously recognize both local alignment marks on the alignment carrier and the die imparts high accuracy in die bonding. Furthermore, by configuring the cameras of the camera unit in the x-y plane (horizontal plane or side-by-side), the integrated camera module is a compact module in the z or vertical direction. This advantageously decreases the movement of the bond head to the panel along the vertical distance between the bond head and the alignment carrier, enhancing throughput.

FIG. 5c shows an exemplary configuration of distances 501 of components of the camera unit. For example, distances of the lens to prism, the prism surface to mirror surface, the mirror surface to prism surface, the prism surface to prism surface, the prism surface to mirror surface, the mirror surface to prism surface, the prism surface to ring glass, the glass surface to glass surface, and the prism surface to panel are shown. The units of the distances are in millimeters (mm). The distances include actual distance and distance in air. The camera unit may include other distance configurations for the components.

Figure 6:
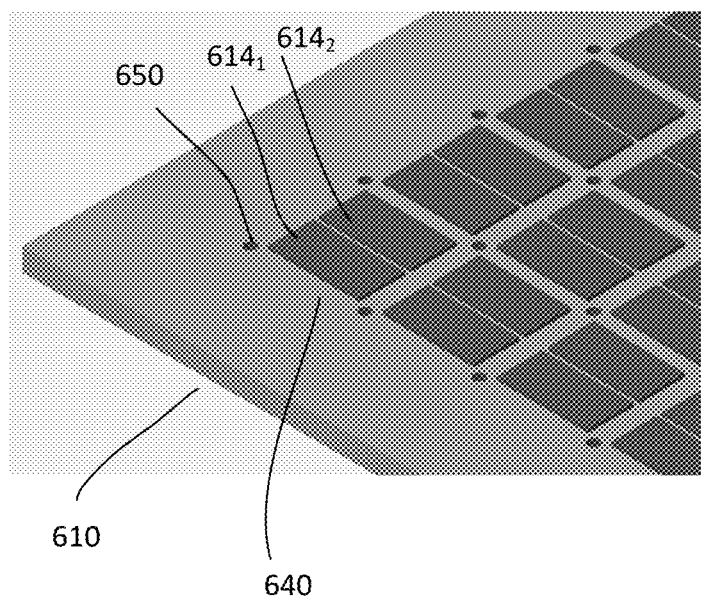
FIG. 6 shows a portion of another embodiment of an alignment carrier.

FIG. 6 shows a simplified diagram of a portion of an embodiment of an alignment carrier 610. The alignment carrier includes a plurality of die bond regions 640 arranged in a matrix format. The die bond regions may be separated into blocks of die bond regions. Surrounding a die region are local die alignment marks 650. For example, four local alignment marks are provided for each die bond region, surrounding corners of the die attach region. Providing other numbers of local alignment marks as well as other configurations of local alignment marks may also be useful.

In one embodiment, a die attach region is configured to attach multiple dies. For example, as shown, a die attach region includes first and second die attach regions configured for attaching first and second dies $614_1$ and $614_2$. Attaching other numbers of dies to a die attach region may also be useful. The multiple dies of the die region are attached using the same local die alignment marks. Using the same local die alignment marks ensures relative accurate positioning of the dies on the die attach regions. Furthermore, using the same local die alignment marks enables accurate die positioning for interconnections between dies, such as high annular ring tolerance. In addition, using the same alignment marks eliminates errors due to hole positions. For example, if separate alignment marks are used for positioning the multiple dies, then the error due to the hole position may be added to the positional error between the dies.

As described, the local alignment marks are disposed outside of the die attach regions of the die bond region. This is advantageous since, as already discussed, this enables the same local die alignment marks to be used for attaching the dies. However, in some cases, the alignment marks may be disposed within the die attach regions. In such cases, each die attach region of the die bond region may need respective sets of local alignment marks. In other cases, there may be a combination of alignment marks within and outside of a die attach region of a die bond region. It is understood that various configurations of local alignment marks for the die attach regions of the die bond region may be employed.

Figure 7A:
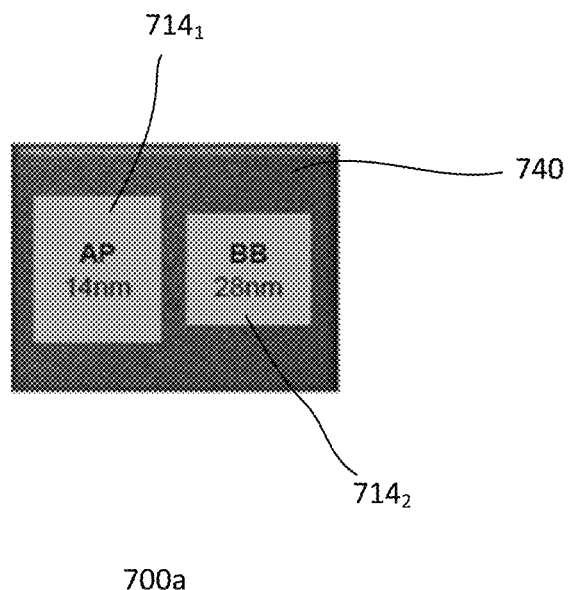
FIGS. 7a-b show an exemplary die layout of a die bond region with multiple dies.
Figure 7B:
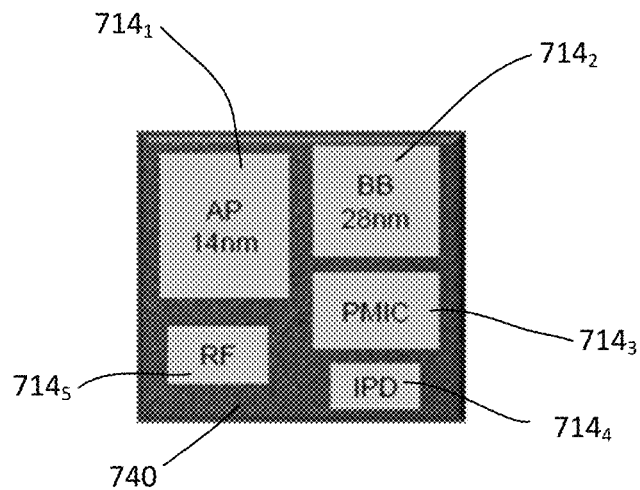

FIGS. 7a-b show embodiments of multiple dies attached to a die attach region using the same local die alignment marks. FIG. 7a illustrates a configuration for attaching first and second dies $714_1$ and $714_2$ on a die attach region 740 using the same local die alignment marks. As shown, the first die may be an AP die formed using 14 nm technology while the second die may be a BB die formed using 28 nm technology. As for FIG. 7b, it illustrates a configuration for attaching dies $714_1$-$714_5$. As shown, the dies include an AP die formed using 14 nm technology, a BB die formed using 28 nm technology, a power management integrated circuit (PMIC) die, an integrated passive device (IPD) die and a radio frequency (RF) die. Other configurations of multiple dies on a die attach region may also be useful.

As described, the alignment carrier may be employed for packaging MCMs. For example, dies of different types with different functions can be packaged into a single packaging structure using the present alignment carrier with local alignment marks and bonding assembly. Accurate alignment can be achieved for MCMs using the alignment carrier and die bonder.

Bonding different types of dies on the alignment carrier may be achieved using various techniques. In one embodiment, separate die bonders may be employed for bonding the different types of dies on the carrier. For example, a first die bonder is employed to bond a first type of die of the MCM on the alignment carrier. After bonding of the first type of dies onto the alignment carrier is completed, the carrier is transferred to a second die bonder for bonding the second type of die of the MCM onto the carrier. This process may be repeated until all types of dies of the MCM are bonded onto the carrier, one type of die after another. In another embodiment, the same die bonder may be employed to bond the different types of dies of the MCM onto the carrier. For example, after completion of bonding the first type of dies of the MCM onto the carrier, the die bonder is reprogrammed to bond the second type of die. The process is repeated until all types of dies are bonded onto the alignment carrier. The use of local alignment marks in MCM applications advantageously enables different dies to be bonded by different die bonders while still maintaining the same base reference and relative accuracy. This is not possible with conventional techniques, such as those using global alignment marks.

Figure 8A:
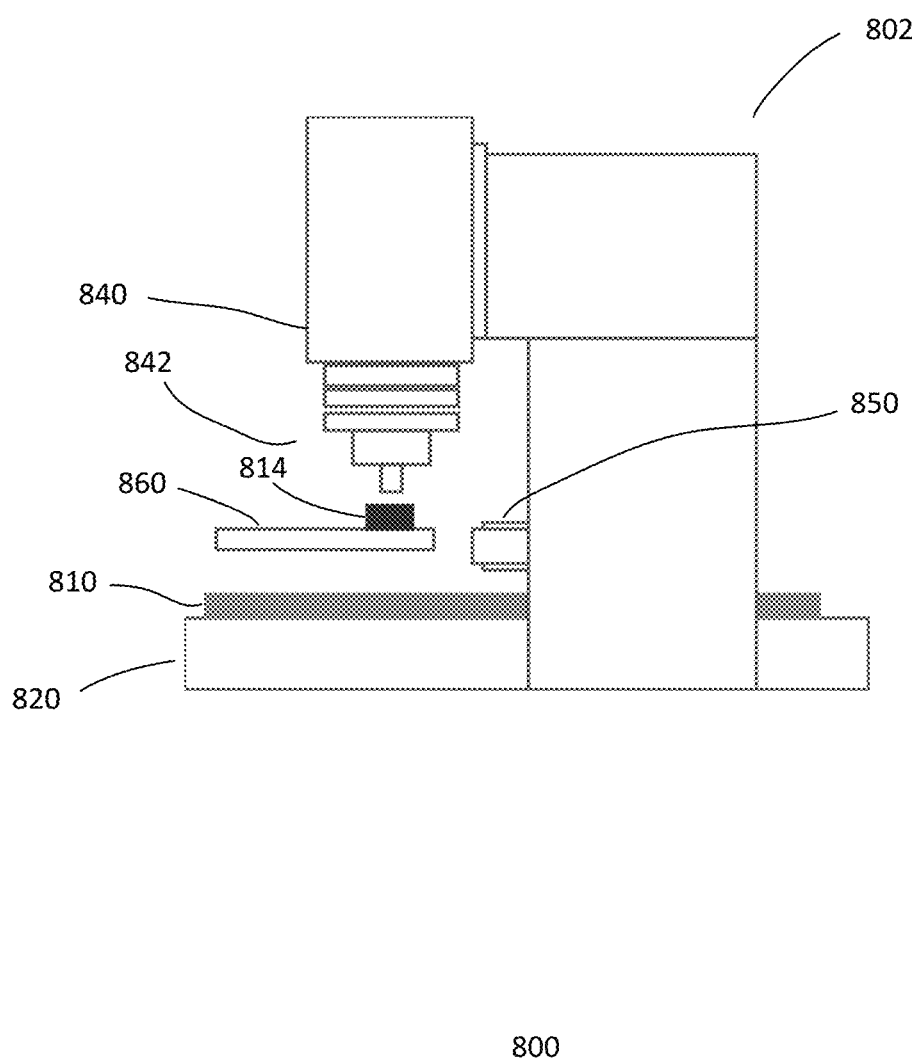
FIGS. 8a-f show a simplified process for attaching a die onto a die bond region of an alignment carrier.

FIGS. 8a-8f show simplified diagrams depicting an embodiment of a process 800 for die bonding on an alignment carrier. Referring to FIG. 8a, a die bonder 802, such as that described in, for example, FIGS. 4 and 5a-5b, is shown. An alignment carrier or panel 810 is disposed on the base assembly 820. A support alignment assembly may align the bonding head to the die bonding region on the carrier. For example, coarse alignment of the bonding head 842 to the carrier is performed. A die feeder assembly 860 feeds a die 814 to the bonding head. For example, the die feeder extends under the bond head.

Figure 8B:
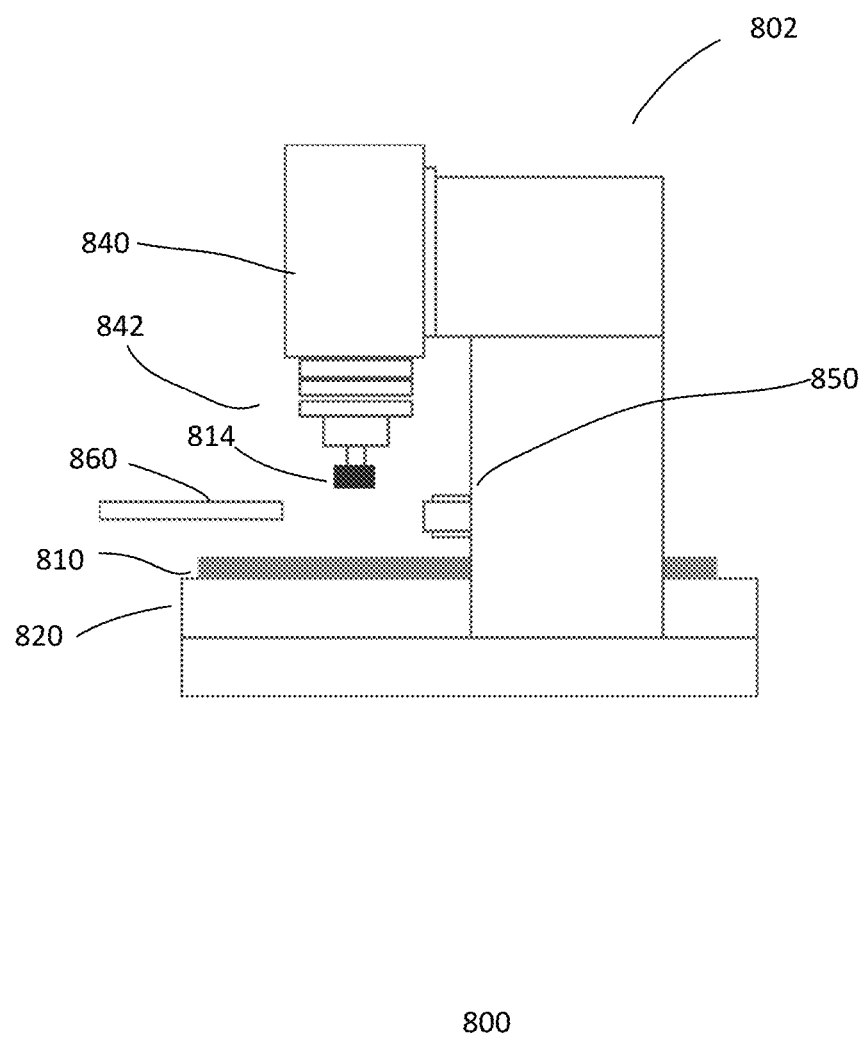

Referring to FIG. 8b, the bonder picks up the die 814 from the feeder 860. For example, the bonding assembly actuator 840 positions the bond head 842 on top of the die and the bonding head actuator actuates the bonder of the bond head to pick up the die. The bonder may employ vacuum pressure to pick up the die from the die feeder. After the die is picked up, the die feeder is retracted away, exposing the die attach region on the carrier on which the die is to be attached. It is understood that the coarse alignment of the alignment carrier can be performed after die pickup.

Figure 8C:
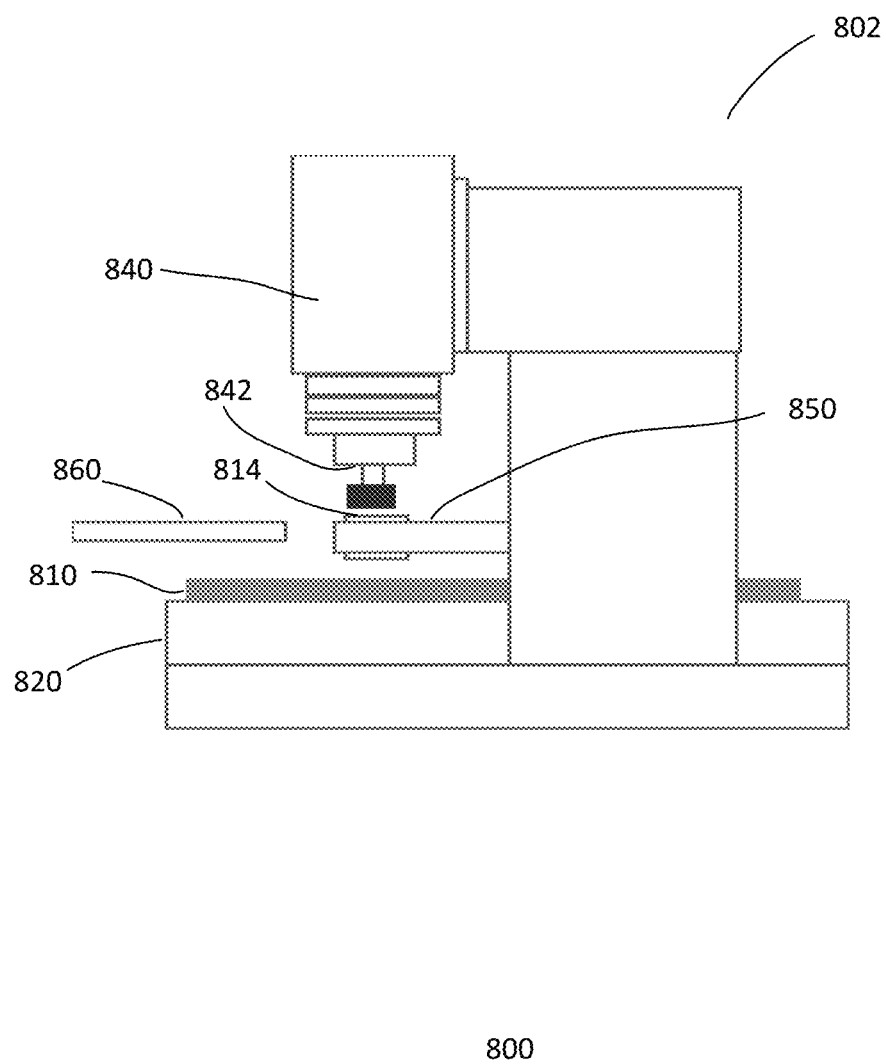

In FIG. 8c, the camera module 850 is extended for alignment. For example, the camera module is extended into position for fine alignment. Fine alignment includes positioning the bonding head so that the die is aligned to the die attach region, both in the x and y directions and also rotationally.

Figure 8D:
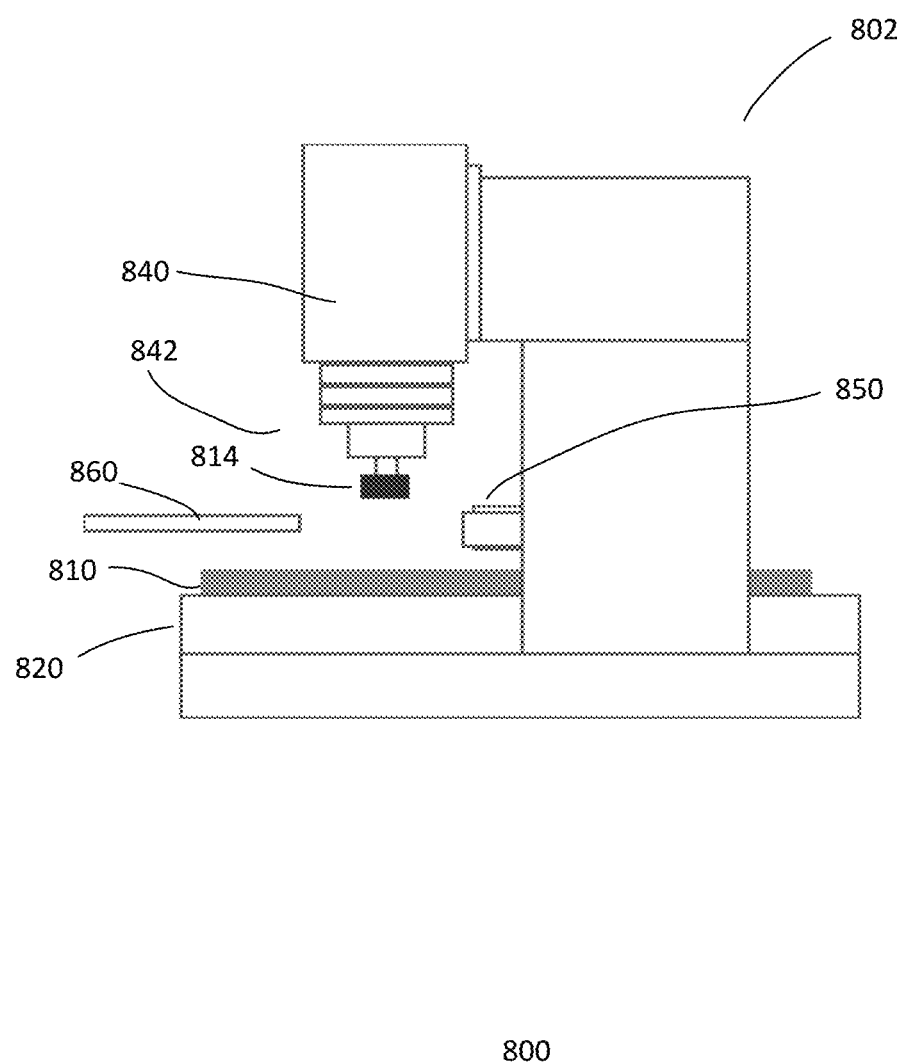
Figure 8E:
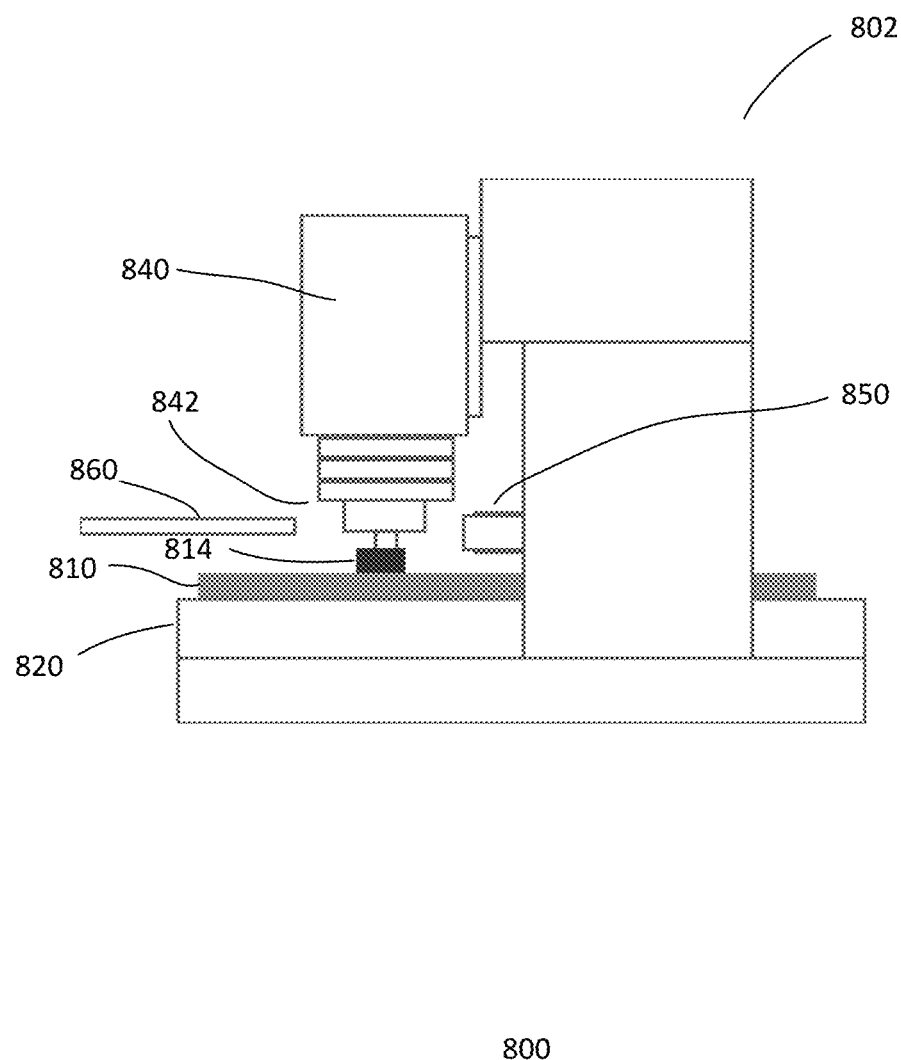
Figure 8F:
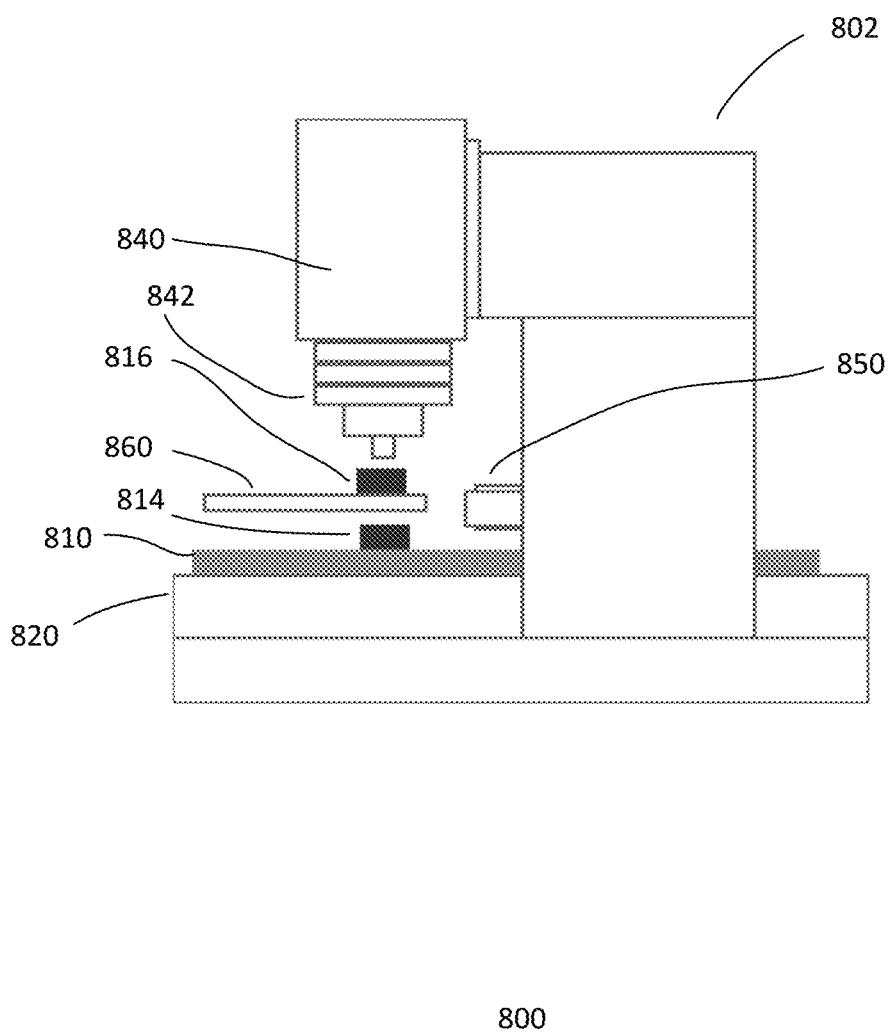

As shown in FIG. 8d, after fine alignment of the die to the die attach region is achieved, the camera module 850 is retracted, exposing the die attach region on the carrier 810. In FIG. 8e, the bonding assembly is actuated to move the bonding head vertically to attach the die to the die attach region on the alignment carrier. After the die is attached, the process continues to attach a next die, as shown in FIG. 8f. For example, the bonding head is translated to the next die attach region stage on the carrier 820 and the die feeder 860 provides another die 816 to the die bonder. The process repeats by aligning and attaching the die to the die attach region until all die attach regions on the carrier are bonded with dies. Furthermore, the controller of the system is programmed to know whether an alignment die or a live die is to be supplied to the bonding tool, based on which die region on the panel for bonding.

As previously discussed, the die bonder may be configured with a translated base assembly to perform coarse alignment while the support alignment assembly performs fine alignment. In addition, alignment dies may be the same as a live die or specifically for alignment purposes.

Figure 9:
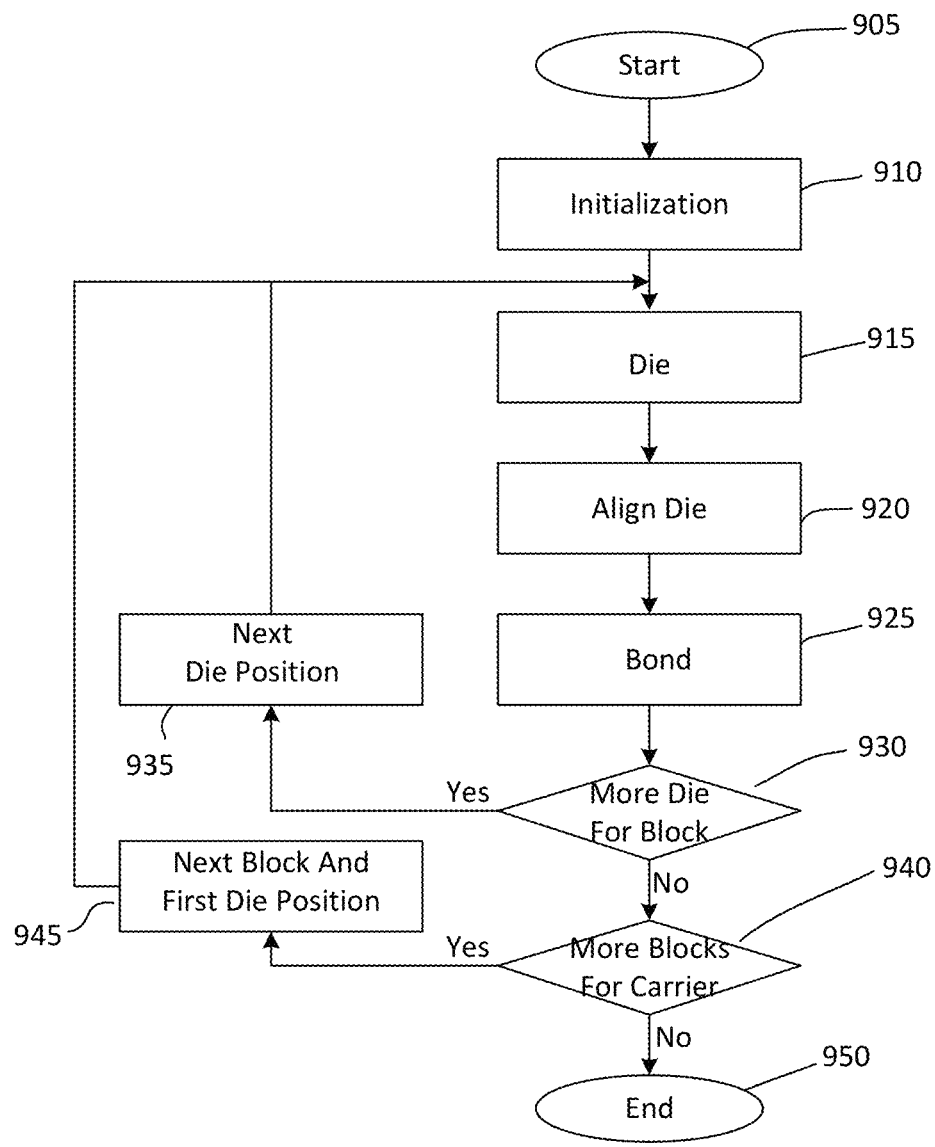
FIG. 9 shows a simplified flow for die bonding using an alignment carrier.

FIG. 9 shows an embodiment of a process flow 900 for die bonding using an alignment carrier. The bonding process starts at 905. Initialization may be performed at 910. Initialization may include information regarding the bonding process. For example, the size of the carrier, number of the blocks, size of the blocks, the number of dies in a row and number of dies in a column. In addition, initialization information may include the starting point of the bonding process, such as the starting block and starting die position within the block, and which die positions are live die positions and alignment die positions. Other information may include carrier alignment points in a carrier CAD file and die alignment points in a die CAD file to facilitate alignment.

At 915, a die is provided to the bonding tool. For example, an appropriate die (live or alignment die) is provided to the bonding head unit by a die feeder. The bonding head picks up the die from the die feeder. After die pickup, the die feeder is retracted to expose the die region on which the die is to be bonded. For example, coarse alignment of the die region is performed prior to die pickup. In other cases, coarse alignment of the die region may be performed after die pickup. The support alignment assembly performs fine alignment of the die to the die bonding region at 920. For example, the camera module extends to between the die and the alignment carrier. Based on the input from the camera module, the controller aligns the die to the die attach region, both in the x and y directions as well as the rotational angle.

Once the die is aligned to the die attach region, the camera module is retracted, enabling the bonding head to move vertically downwards to place the die on the die attach region of the carrier at 925. At 930, the die bonder determines if there are more dies to be bonded. For example, if there are more dies in the block to be bonded. If yes, the bonding head is translated to the next die position for bonding at 935. Thereafter, the process repeats from 915 to 930 until the block is completed. If the block is completed, the process proceeds to 940 to determine whether there are more blocks on the carrier to be bonded. If there are additional blocks to be bonded, the process proceeds to 945. The head translates to the first die position of the next block on the carrier and proceeds to 915. Thereafter, the process repeats from 915 to 930 until the block is completed. The process continues until all blocks are processed. Once all blocks have been processed, the process terminates at 950.

As described, the carrier is configured in multiple blocks. However, it is understood that the carrier may be configured as a single block of die bonding regions. In such, the process may be modified to exclude determining if there are more die blocks.

Furthermore, as described, die bonding is performed for both alignment dies and live dies. For example, a die bonder loads the appropriate die for bonding based on the type of die bonding location until the whole block is bonded and then to the next block until die bonding of the alignment carrier is completed. Alternative approaches may be employed for die bonding of an alignment carrier. For example, alignment dies may be bonded before bonding live dies using the same die bonder. Alternatively, live dies may be bonded first followed by bonding the alignment dies. In other cases, alignment dies and live dies are bonded using different die bonders. In the case where alignment dies and live dies are the same dies, they can be all bonded using the same bonder as well as in the order according to the sequence of die bond regions.

Figure 10A:
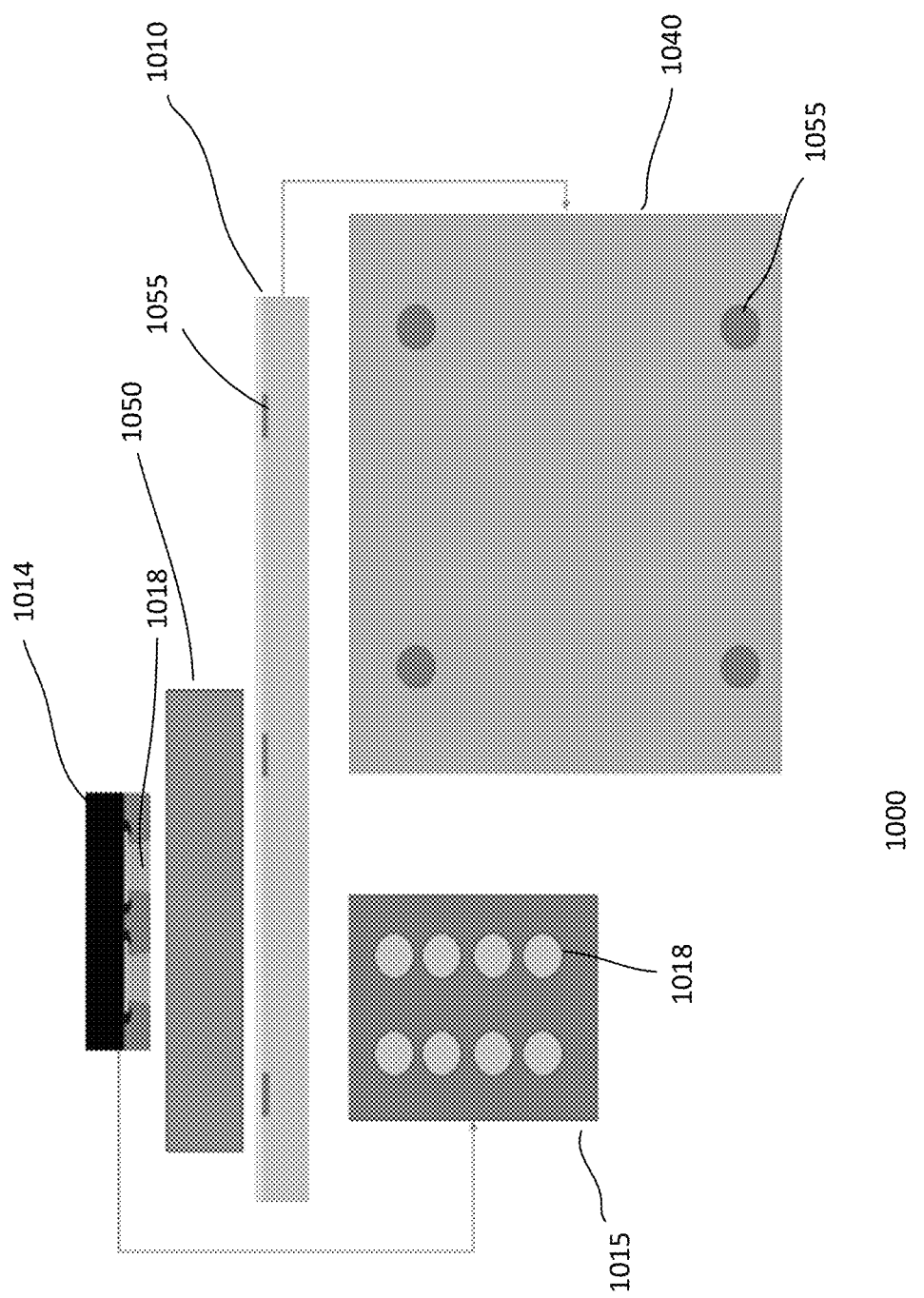

FIGS. 10a-d show simplified illustrations of an embodiment of an alignment process 1000. As discussed, the alignment performed by the die bonder is a local die alignment with a direct or straight line of sight to the die bonding region on the alignment and to the die. For example, FIG. 10a depicts the camera module 1050, the die 1014 and the alignment carrier or panel 1010 in alignment position prior to bonding. For example, the camera module 1050 is disposed between the die 1014 and the die bonding region 1040 of interest on the alignment carrier 1010. The camera module utilizes local die alignment marks 1055 of the die bonding region 1040 for precisely aligning the die 1014 to the die attach region. As shown, the bottom surface of the die which is bonded to the carrier is the active surface. The active surface of the die may be covered by a transparent dielectric layer, such as an ABT layer. This enables the lookup camera to view the features of the active surface to serve as alignment marks. The views of the bottom surface of the die 1015 and the die region 1040 as captured by the camera unit are shown in detail. For example, the view of the bottom surface includes features such as vias 1018 while the view of the die region includes local die alignment marks 1055 surrounding the die attach region. In other embodiments, the bottom surface may be the inactive surface of the die.

Figure 10B:
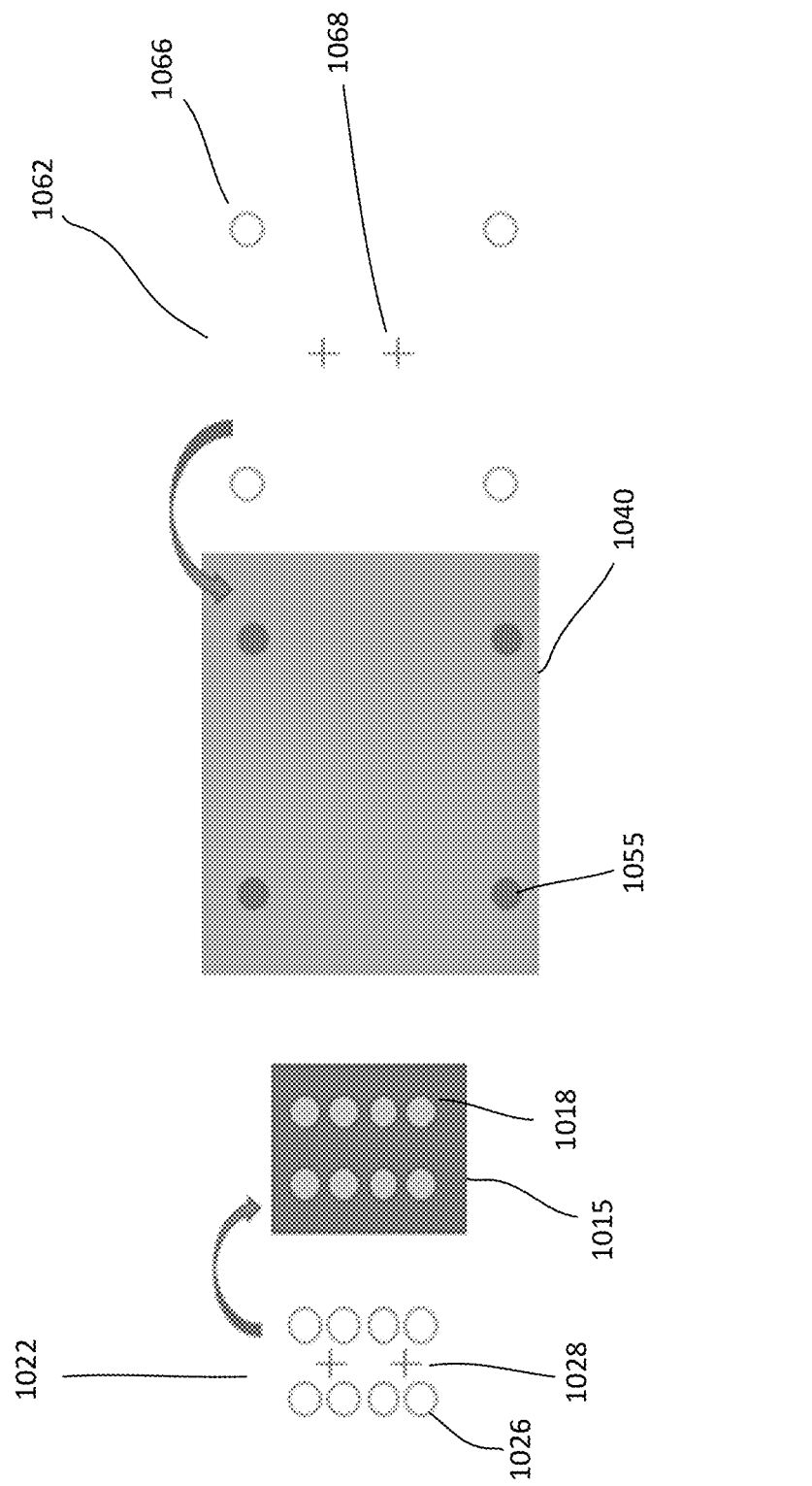

FIG. 10b illustrates how alignment is performed. For example, alignment involves matching a die pattern 1022 of the die 1015 from the die CAD file and the die region pattern 1062 of the die attach region 1040 from the carrier CAD file. As shown, the die region pattern includes features such as alignment marks 1066 and the die pattern includes features such as vias 1026. In addition, the die pattern includes die alignment points 1028 and the die region pattern includes die region alignment points 1068. As shown, the die alignment points are disposed in a central portion of the die pattern and the die region alignment points are disposed in a central portion of the die region pattern. Locating the alignment marks in other areas of the die pattern and die region pattern may also be useful. For example, the controller can determine the offsets as an input to accurately position the die on the target die bonding region before placement.

Figure 10C:
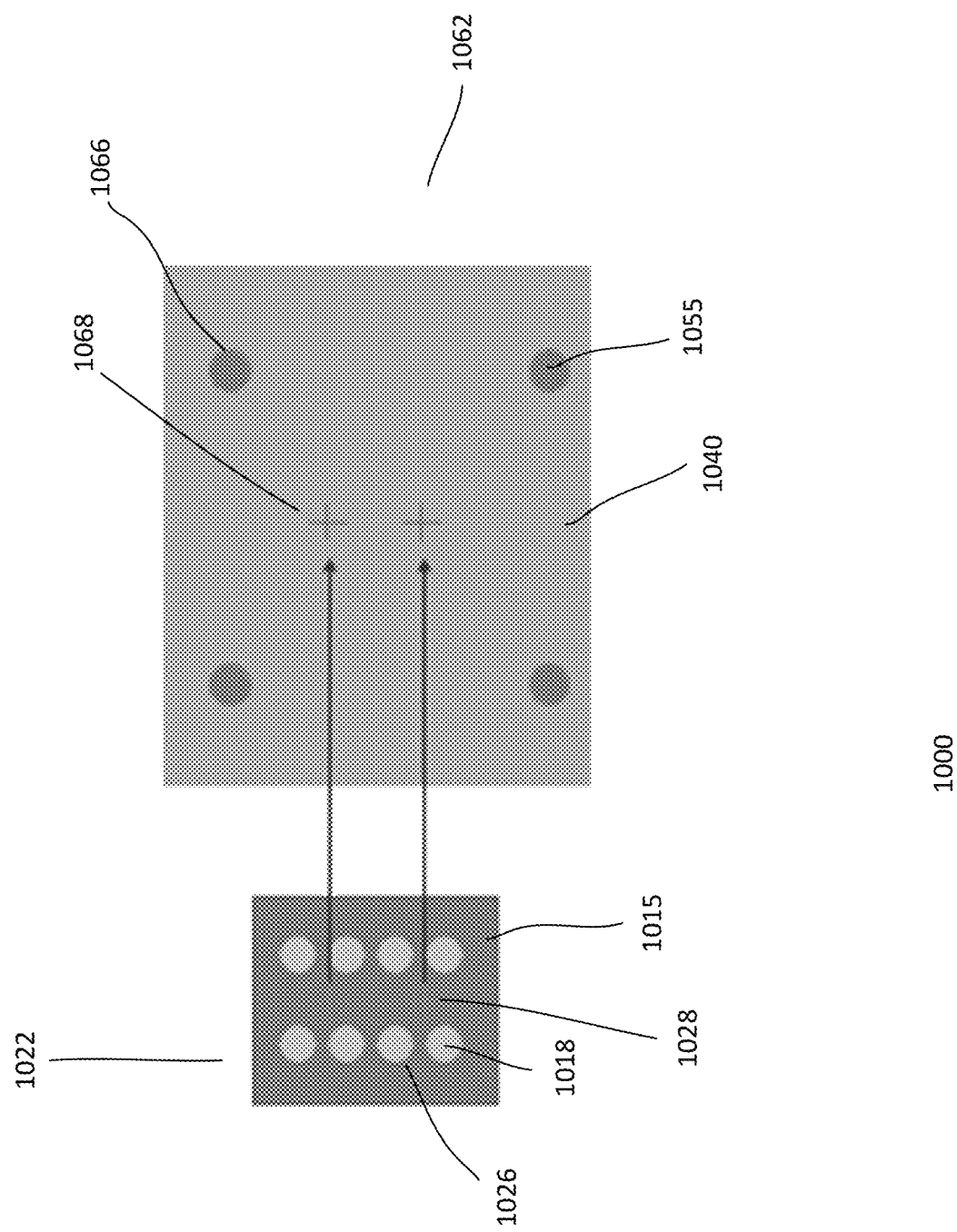

As shown in FIG. 10c, the die pattern and the die region pattern are matched for alignment. For example, the die region pattern is overlaid on to the die region, with the local die alignment marks 1055 matching the alignment marks of the die region pattern and the die pattern is overlaid onto the bottom surface of the die, with the vias 1026 of the die pattern matching the vias 1018 of the die. Thereafter, the die alignment points 1028 on the die pattern are then matched to the die region alignment points 1068 of the die region pattern. This aligns the die to the die region.

Once aligned, the bond head places the die in position on the die attach region. For example, as shown in the top view 1005a and side view 1005b in FIG. 10d, dies 1014 are aligned on adjacent die regions. Furthermore, as shown, adjacent die regions may share common local die alignment marks 1055 located therebetween. This further reduces footprint of the die regions, enabling a higher number of dies to be fitted onto the blocks of the panel.

Figure 11A:
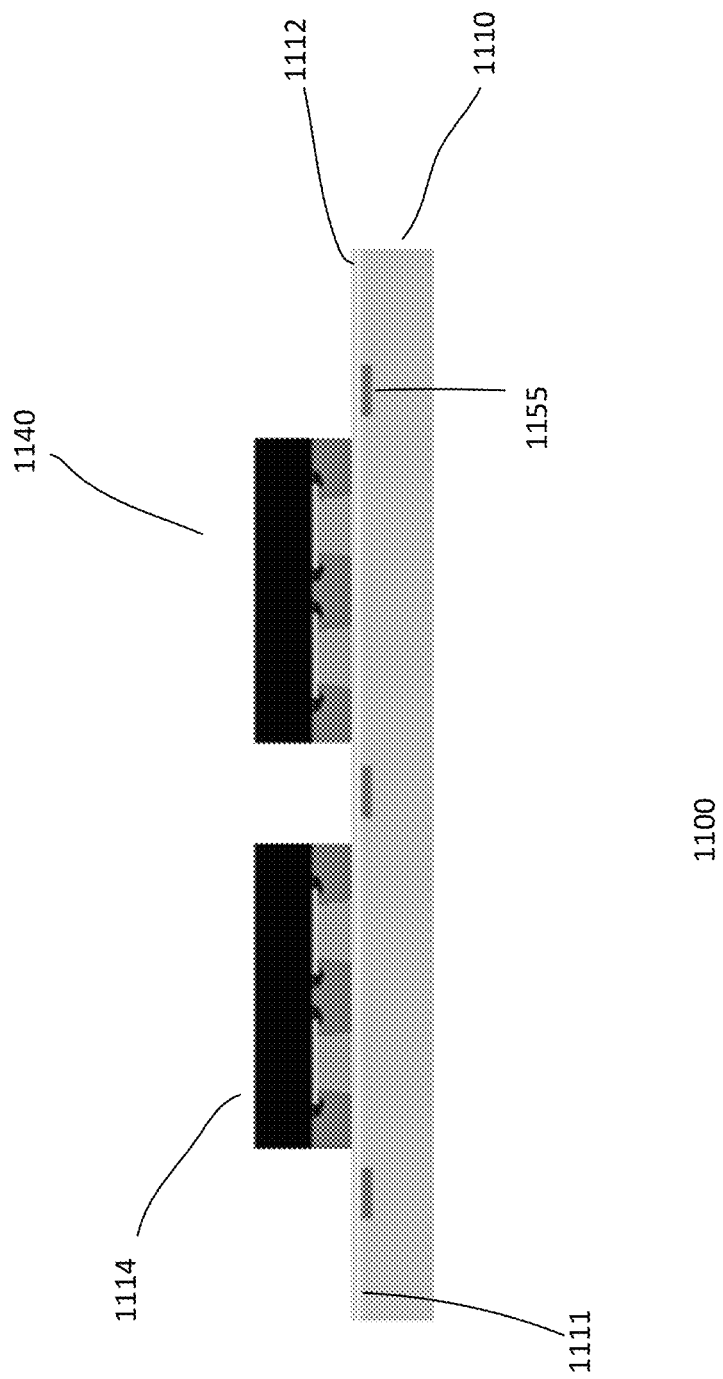

FIGS. 11a-f show simplified cross-sectional views of an embodiment of a reconstruction process 1100 of dies using an alignment carrier. Referring to FIG. 11a, an alignment carrier 1110 is shown. The alignment carrier includes an active surface 1111 on which a plurality of die regions 1140 are defined. The active surface, for example, may be referred to as the front or first surface. The die regions may be defined according to a carrier CAD file. In one embodiment, the alignment panel is separated into a plurality of blocks, each with a plurality of die regions. However, for simplicity, only two die regions are shown. The active surface of the alignment carrier includes local die alignment holes or marks 1155. In one embodiment, the local alignment marks surround or are outside of a die attach region. Other configurations of local alignment marks may also be useful. For example, the alignment marks may be within the die attach region or inside and outside of the die attach region.

As shown, adjacent die regions share common alignment marks. On the active surface of the alignment carrier, an adhesive tape 1112 is applied. The adhesive tape covers the die regions, including alignment marks. The adhesive tape, in one embodiment, is a transparent adhesive tape, enabling detection of the alignment marks by a camera module of a die bonder for performing local die alignment of a die to a die region. Dies 1114 are attached to the die attach regions. As such, the active surface of the dies are attached to the carrier. Attaching the inactive surface of the dies to the carrier may also be useful. The dies are aligned to the die attach regions of the die regions based on alignment using the local die alignment marks.

Figure 11B:
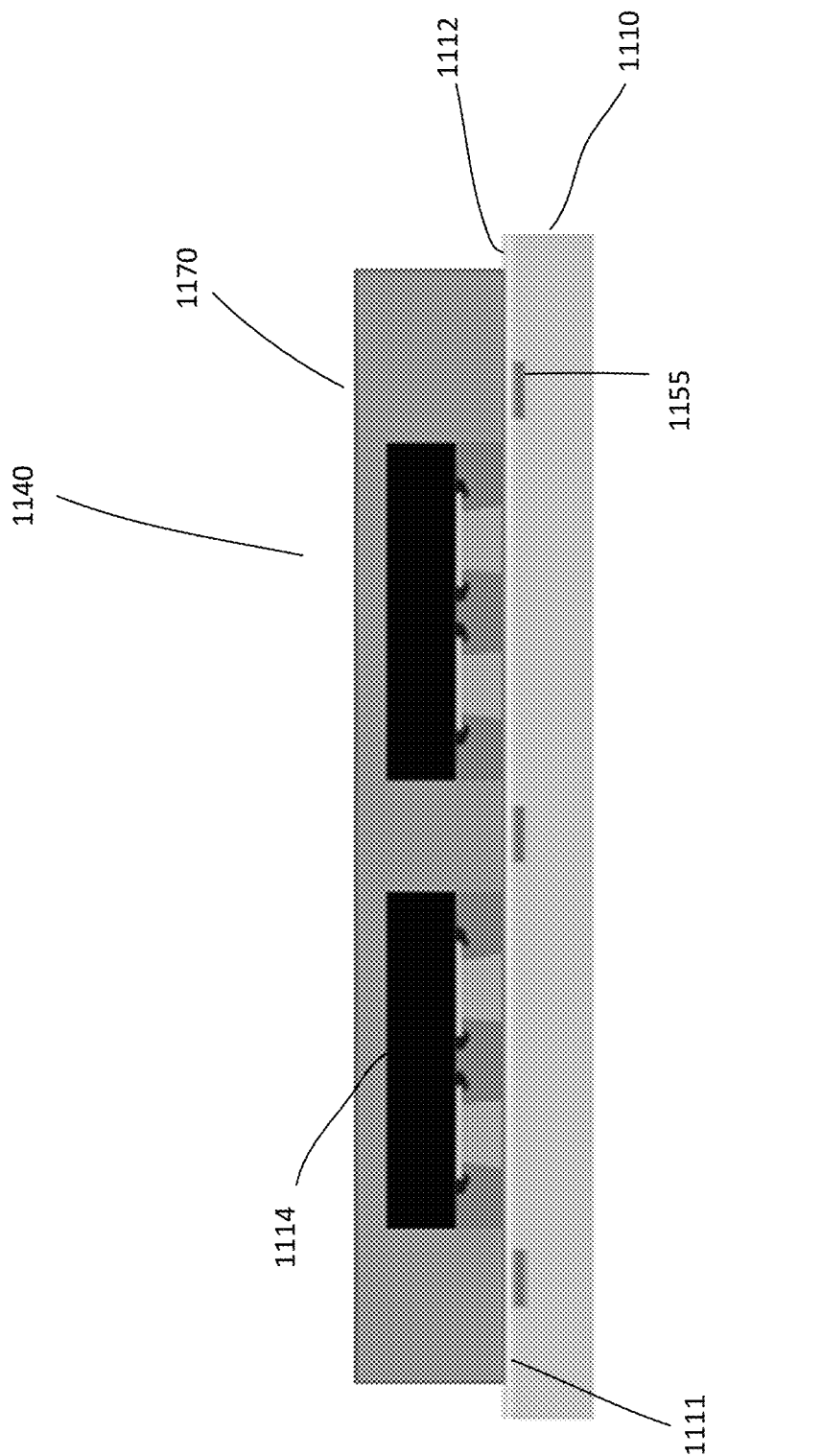
Figure 11C:
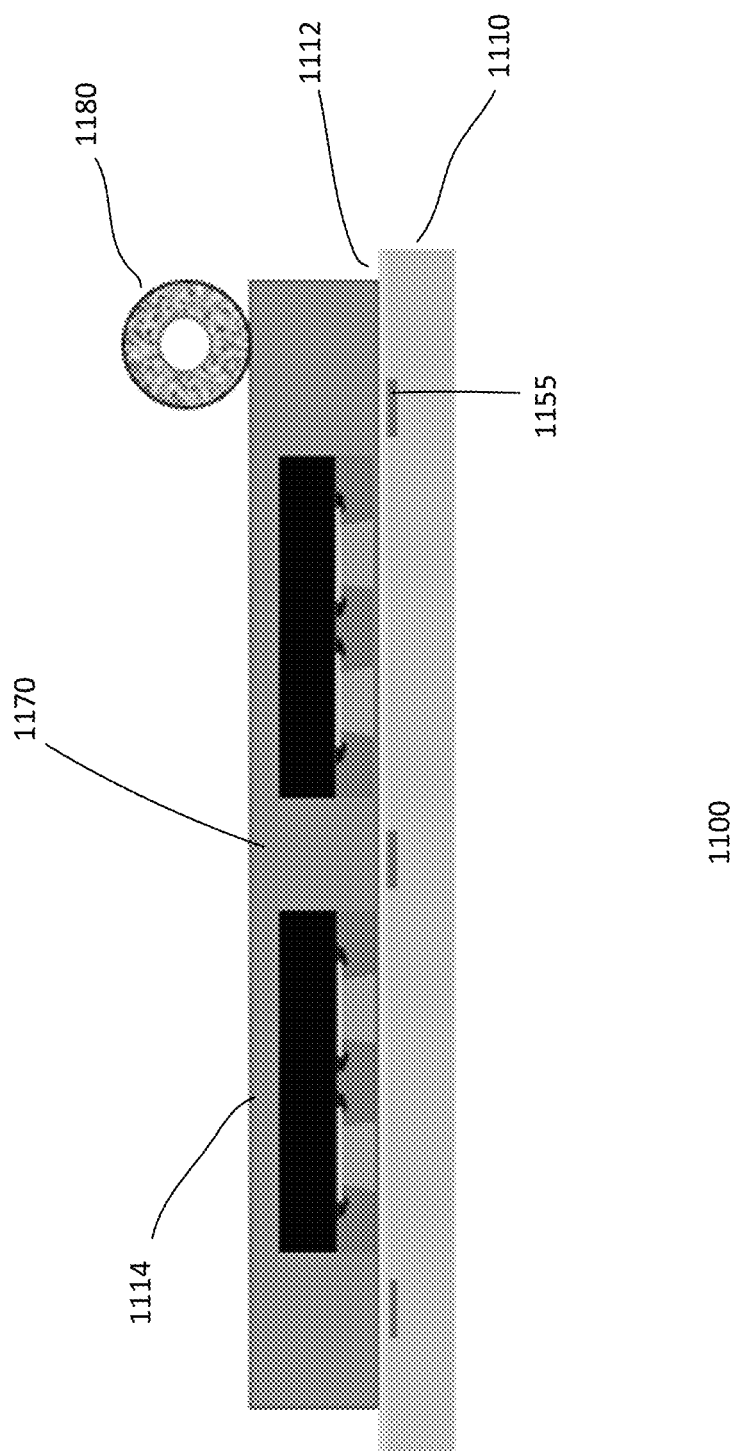

In FIG. 11b, the carrier with bonded dies is subjected to a molding process. For example, a mold compound 1170 is formed over the alignment carrier, covering it and the dies. The mold compound and dies may be referred to as a mold panel while the mold panel on the carrier may be referred to as a panel assembly. The mold compound may be in the form of powder/granules, liquid or film. In one embodiment, compression molding is performed to form the mold compound. Other techniques for forming the mold compound may also be useful. The molding process is a high-temperature process. For example, the alignment panel is subjected to high temperatures and pressure, such as about 150-180° C. and 240-320 TF. The material of the alignment carrier can sustain conditions of the molding process without distortion, warpage or damage. In addition, due to the low CTE material of the alignment carrier, minimum linear variations during temperature changes occur. After the mold compound is formed, the top surface is grounded. For example, the top surface of the panel is grounded using a grinding wheel 1180, such as a resin bonding grinding wheel and polishing tool, as shown in FIG. 11c. For example, the top surface is grounded to the desired height and ensuring a uniform thickness as well as relieving stress.

As discussed, the dies may be attached to the alignment carrier face up (inactive surface attached to the carrier) or face down (active surface attached to the alignment carrier). In the case of a face down bonding, the mold compound covers the inactive sides of the dies attached to the alignment carrier. In such cases, the desired height of the panel may be any height, including exposing the inactive surfaces of the dies. In the case of face up bonding, the grinding exposes the active surfaces of the dies.

Figure 11E:
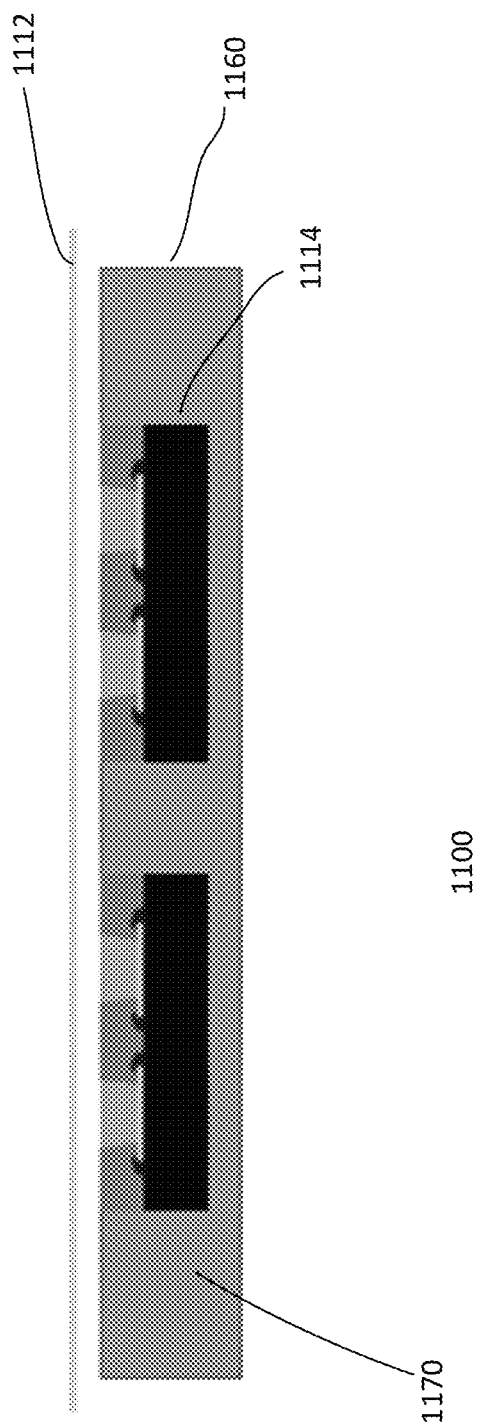

As shown in FIG. 11d, the adhesive tape 1112 is released from the alignment carrier 1110. For example, a release process is performed to separate the alignment carrier from the adhesive tape 1112. In one embodiment, the release process includes subjecting the alignment carrier to a high-temperature process, such as about 210° C. Once the alignment carrier is released from the adhesive tape, it is peeled off from the mold panel 1160, as shown in FIG. 11e. This results in the mold panel 1160 with the active surface of the dies exposed.

Figure 11F:
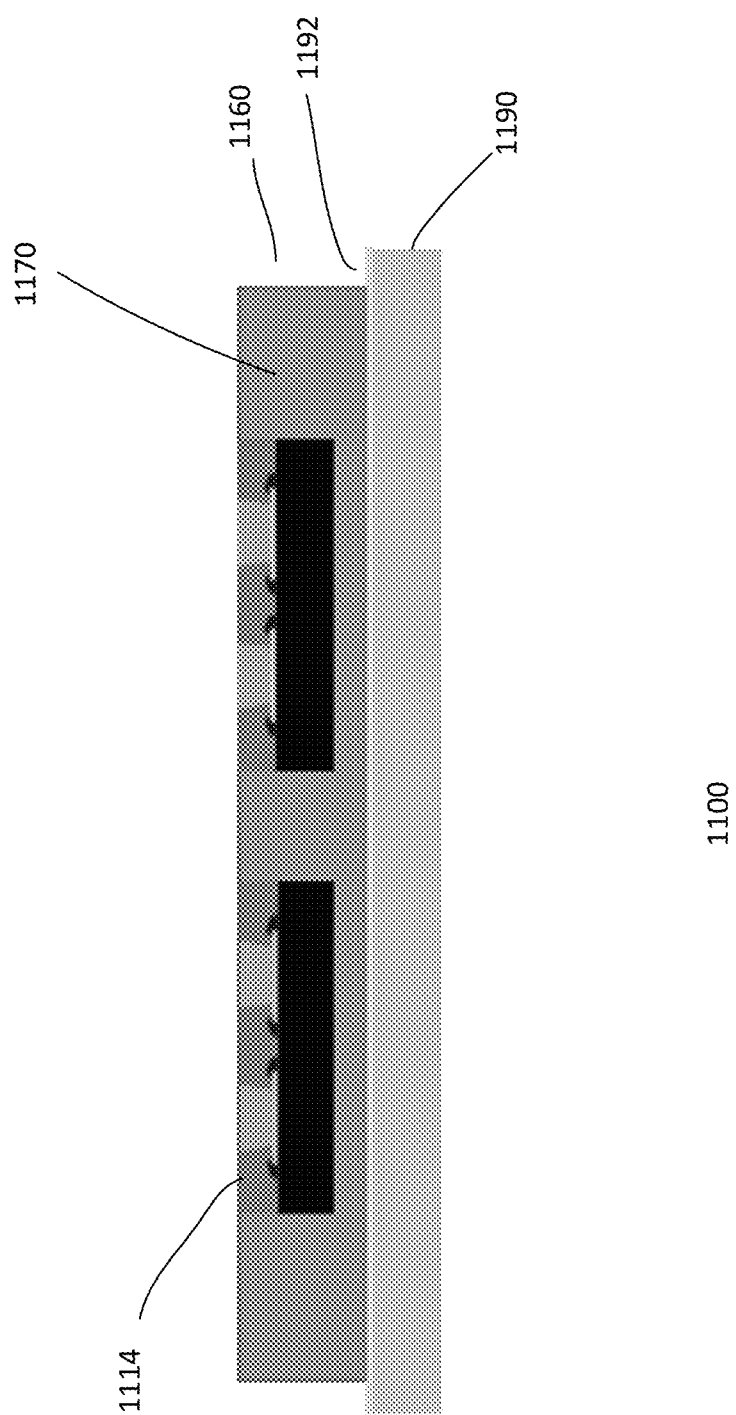

In FIG. 11f, the mold panel 1160 is transferred to a carrier substrate 1190, forming a second mold panel assembly. For example, an adhesive tape 1192 is provided on the carrier substrate, enabling the mold panel to attach to the carrier substrate. The active surfaces of the dies of the mold panel is exposed. The carrier substrate facilitates handling of the mold panel, such as transportation to downstream processes. In one embodiment, the carrier substrate may be similar to the alignment carrier. Using a carrier substrate which is different from the alignment carrier may also be useful.

Figure 12A:
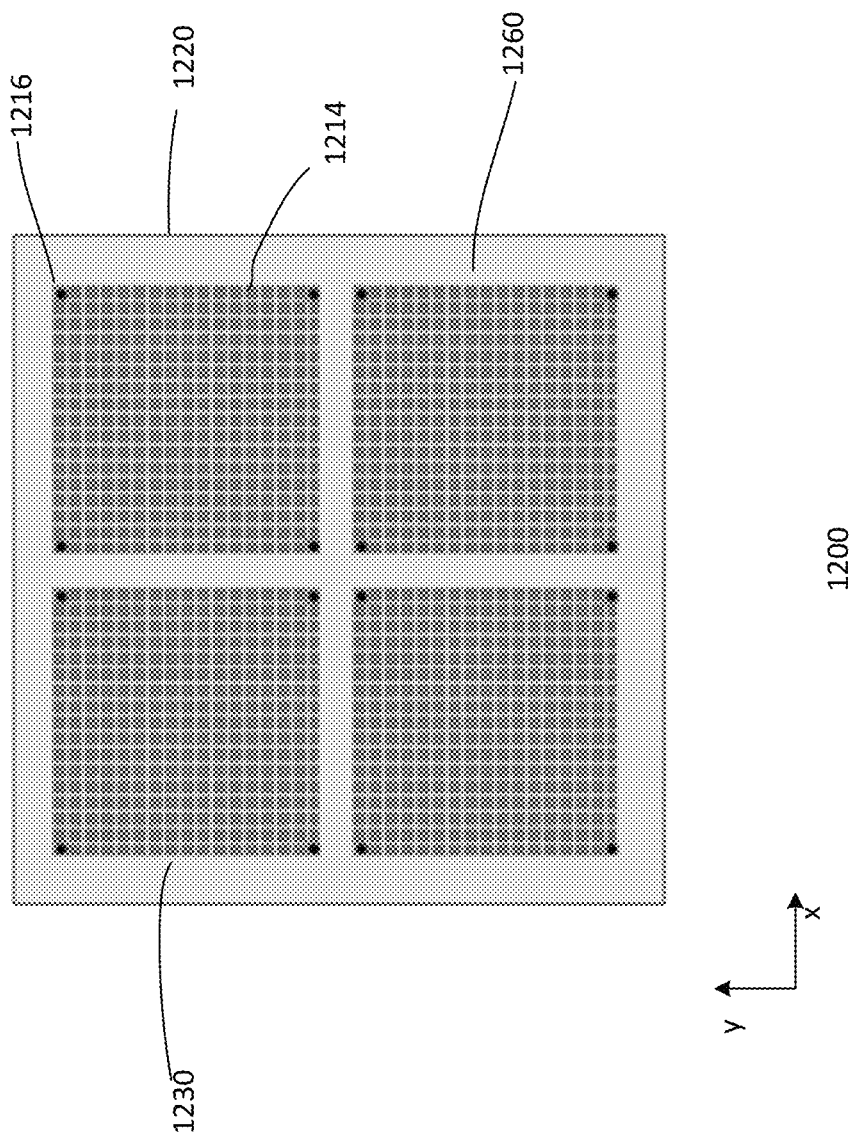
FIGS. 12a-c show a process for die location check on a carrier substrate.
Figure 12B:
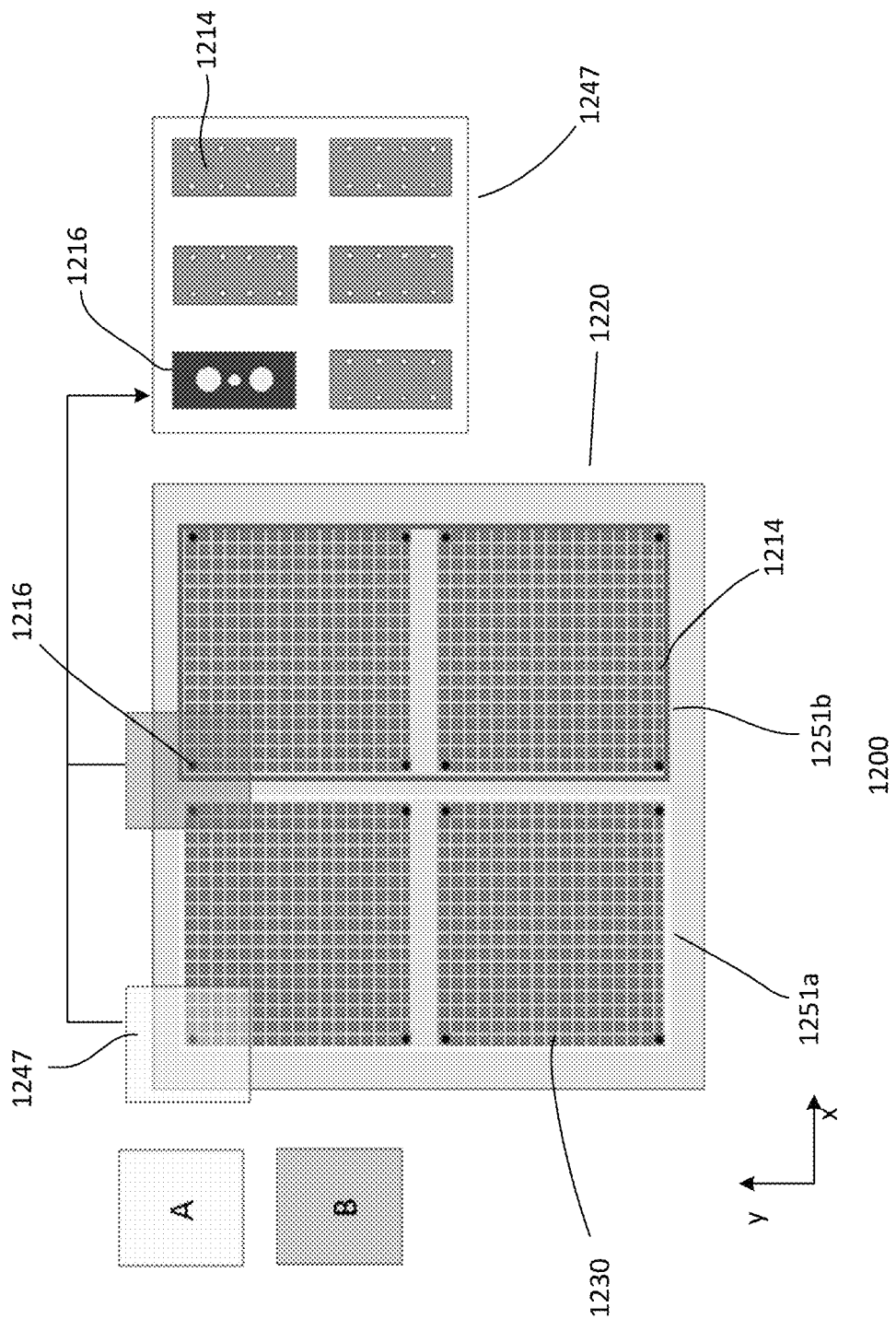
Figure 12C:
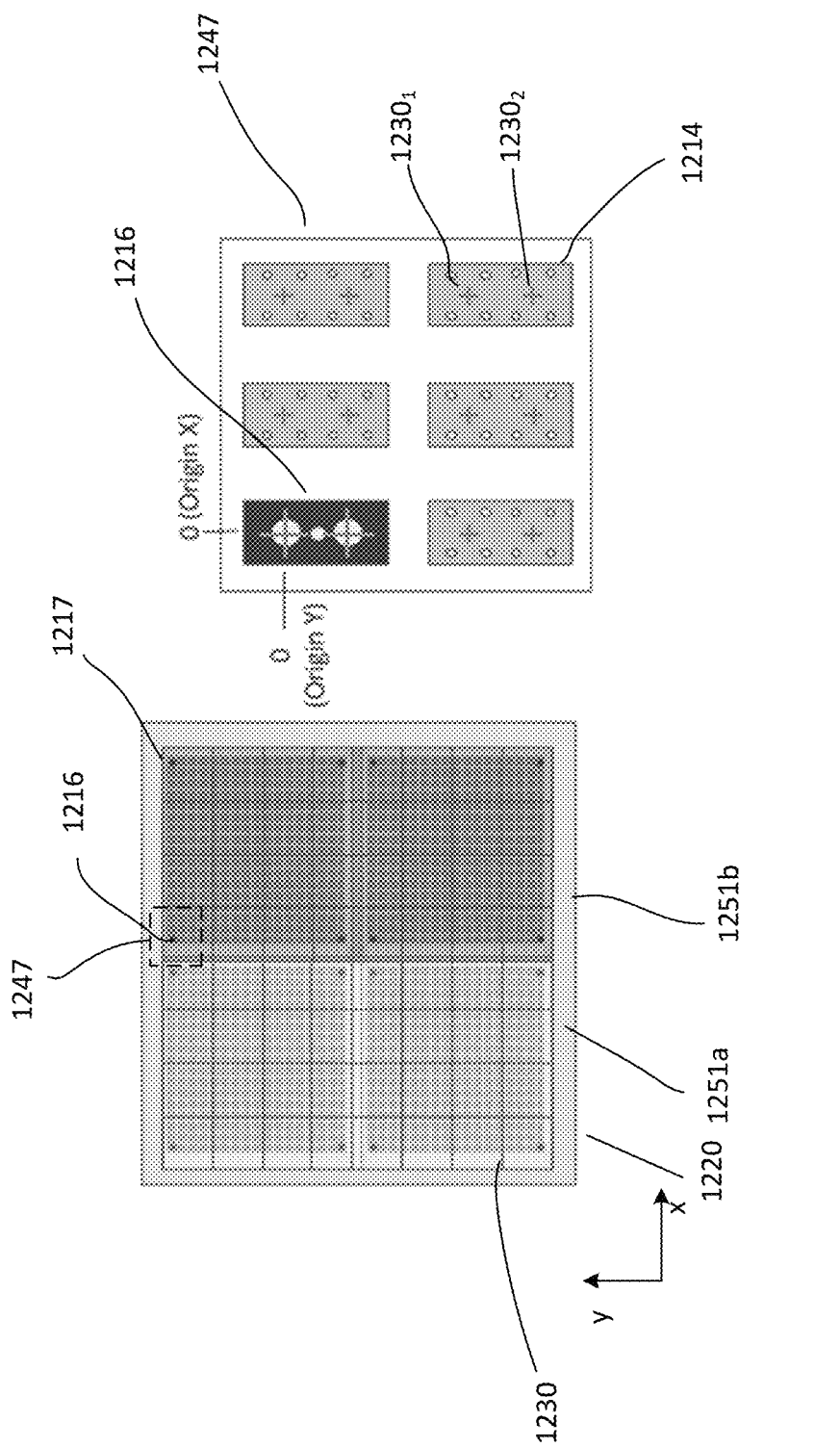

FIGS. 12a-c show an embodiment of a process 1200 for die location check (DLC) on a carrier substrate. Referring to FIG. 12a, a second mold panel assembly is shown. For example, the second mold panel assembly includes a mold panel 1260 attached to a carrier substrate 1220. The mold panel is configured with a plurality of blocks 1230. A block includes a plurality of dies 1214 arranged in a matrix format. For example, the dies of a block are arranged in rows and columns. A block is provided with at least one alignment die 1216 in a designated alignment die region. The number of alignment dies per block may depend on the DLC scheme used. An alignment die serves as a reference point for a block.

Illustratively, a block includes 4 alignment dies located at the corners of the block. For example, each block of the panel includes 4 alignment dies located at the corners of the block. A block may be provided with other numbers of dies and/or other locations. Providing four alignment dies facilitates downstream processes. For purposes of DLC, two alignment dies should be sufficient to determine the angle of the block. Preferably, the alignment dies are in the same x or y axis instead of a diagonal. In some cases, alignment dies may be shared by adjacent blocks.

Referring to FIG. 12b, a die location check scheme is shown. A DLC scan is performed using multiple cameras. The DLC scans the panel assembly and identifies the alignment dies of a block. For example, the alignment dies of each block are identified. As shown, first and second areas (area A and area B) correspond to first and second cameras (camera A and camera B) of the DLC scan. The outlines represent zones scanned by the cameras. For example, the outline of area A represents zones scanned by camera A and the outline of area B represents zones scanned by camera B. As shown, zones 1251a scanned by camera A covers blocks 1 and 3 while zones 1251b scanned by camera B covers blocks 2 and 4. The alignment dies are used to determine the origin for a block. For example, one of the alignment dies serves as an origin die 1216 of a block.

In FIG. 12c, as shown, the alignment die 1216 serves as an origin die for block 1214 (e.g., block 2). A portion 1247 of block 2 containing the origin die 1216 is shown in greater detail. For example, the origin die is used to determine the (0, 0) coordinate of block 2. For example, the 0 or origin point in the x axis and the 0 or origin point for the y axis are determined from the origin die. A die is referenced by at least one reference point. In one embodiment, a die is referenced by two reference points $1230_{1-2}$. Using two reference points facilitates determining the angular position of a die. In one embodiment, an adjacent alignment die of the origin die is measured. The two adjacent alignment dies are used to determine an axis representing the block orthogonality. As shown, the two alignment dies are used to determine an x-axis. In other cases, the two alignment dies may be used to determine a y-axis. Once an axis of block 2 is determined, the system generates the X, Y coordinates of all die locations of block 2. In one embodiment, a die is referenced using two reference points. Using two reference points facilitates determining the angular position of a die. The die locations of all blocks are calculated based on an origin die of the respective block. The results are generated block-by-block, with each block having its own origin and die coordinate data. In an alternative embodiment, the coordinates of all die locations of a block are generated based only on the origin die. For example, the axis representing block orthogonality is not determined.

Figure 12D:
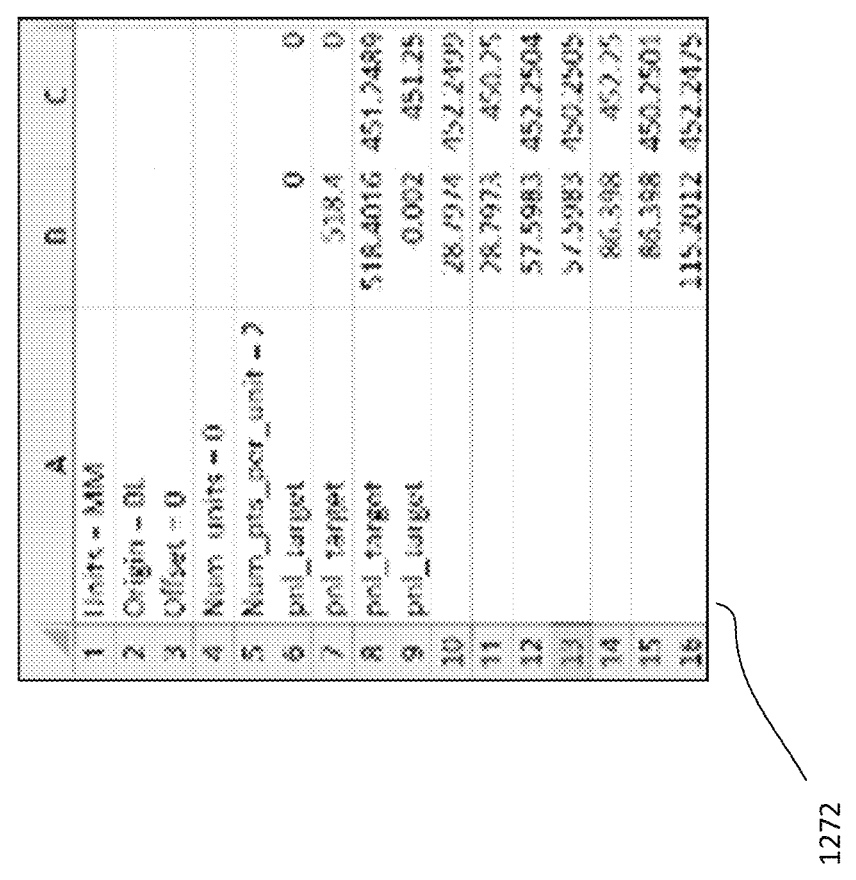

In one embodiment, a DLC export file is created. The DLC export file contains the X, Y coordinates of all die locations of all blocks of the alignment panel. A die location is represented by at least one reference point. A reference point corresponds to a set of X, Y coordinates. In one embodiment, a die location is represented by two reference points. For example, a die location corresponds to two sets of X, Y coordinates. The DLC export file, for example, may be in a CSV format, as shown in FIG. 12d. By reducing the panel into smaller blocks or segments, higher bonding accuracy is achieved.

Figure 12E:
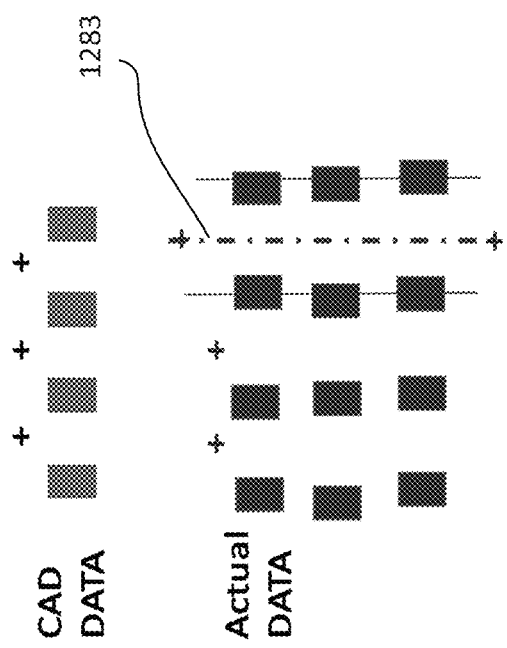
FIG. 12e shows calculated saw lines of the panel assembly from DLC.

An advantage of the present DLC process, as described, is that it can generate alignment die as well as live die positions. Live die positions of the different blocks can be calculated based on the origin alignment die of a block, with or without block orthogonality being taken into account. In addition, saw lines 1283 can be calculated, as shown in FIG. 12e. The saw lines can be calculated by averaging the position of all the die in a row or column.

Figure 13A:
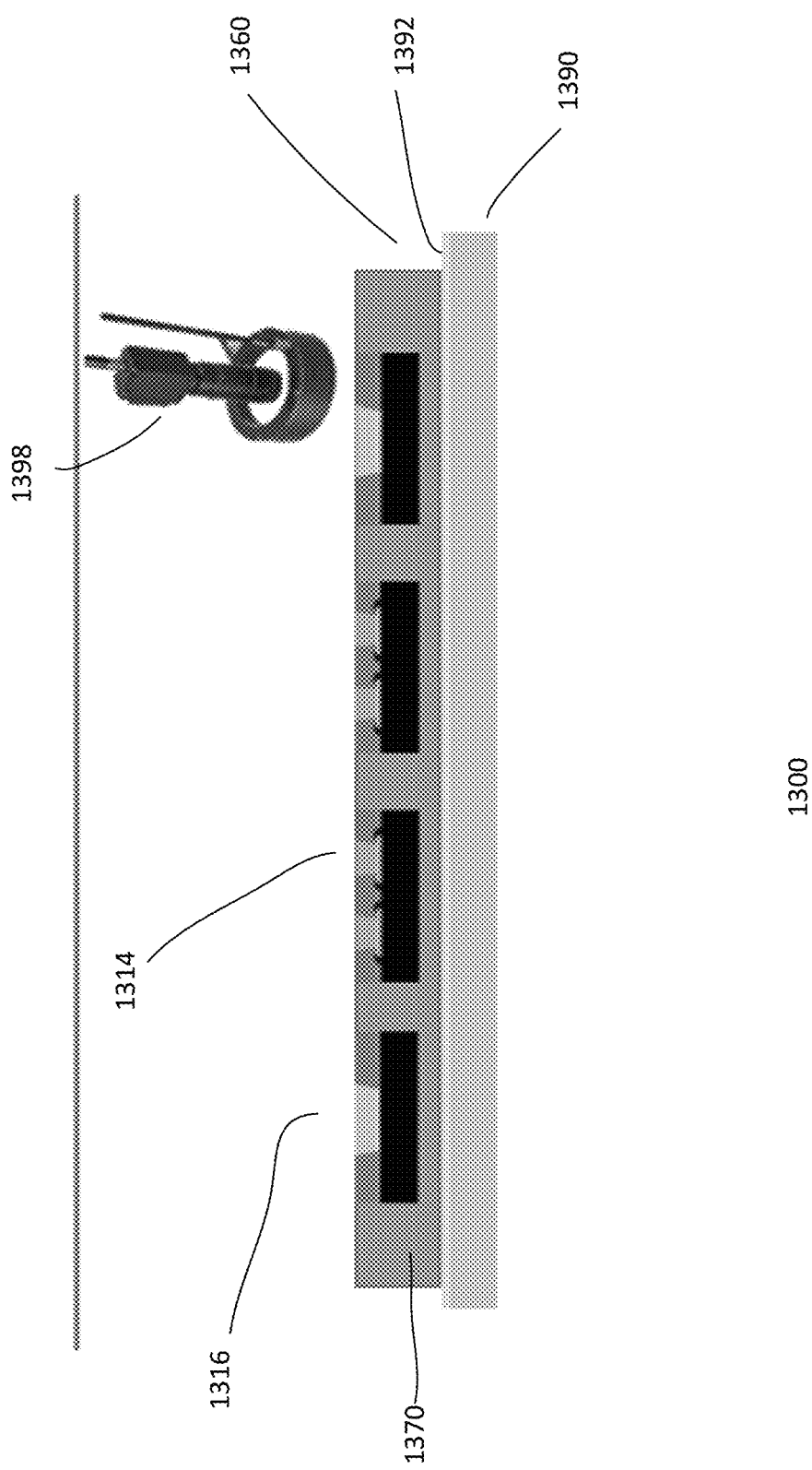
FIGS. 13a-e show simplified cross-sectional views of an embodiment of downstream processing of dies on a carrier substrate.

FIGS. 13a-e show simplified cross-sectional views of an embodiment of downstream processing 1300 of dies on a second panel assembly. Referring to FIG. 13a, a carrier substrate 1390 mounted with a mold panel 1360 is shown. For example, a second panel assembly is shown. The mold panel includes dies encapsulated with a mold compound 1370. The mold panel is attached to the carrier substrate by an adhesive tape 1392, forming a downstream workpiece. Types of adhesive tapes, such as thermal release tape, may be used to facilitate die bonding. In one embodiment, a bottom surface of the mold panel is attached to the carrier substrate. This top surface of the mold panel includes exposed active surface of the dies 1314 and 1316. The exposed active die surfaces include via openings which expose bond pads.

The mold panel may be configured with a plurality of blocks. A block includes a plurality of dies arranged in a matrix format. For example, the dies of a block are arranged in rows and columns. In one embodiment, a block is provided with at least one alignment die 1316 in a designated alignment die region. The number of alignment dies per block may depend on the DLC scheme used. An alignment die serves as a reference point for a block.

For simplification, the cross-sectional view may depict a simple block having a 4×4 matrix of dies. The block includes alignment dies 1316 disposed at corners thereof and normal dies 1314 disposed in remaining die locations. It is understood that the mold panel may include multiple blocks and that a block may include a much larger sized matrix of dies that have more than than a 4×4 matrix.

A DLC scan is performed on the downstream workpiece using a camera module 1398. The camera module may be configured with multiple cameras for identifying the alignment dies. The scan is configured to scan the whole mold panel and generate a map of the die locations based on the origin points on the mold panel. The system generates the X, Y coordinates of all die locations with respect to the origin dies for the mold panel. A DLC export file is created which contains the X, Y coordinates or map of all die locations of the mold panel on the carrier substrate.

Figure 13B:
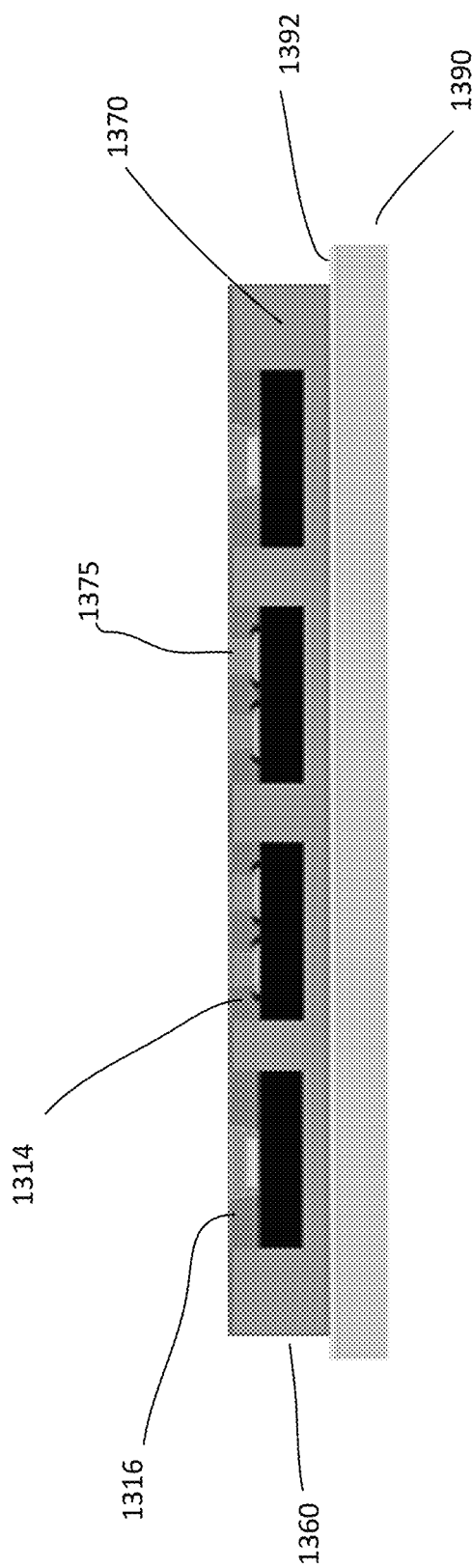

Referring to FIG. 13*b*, the DLC export file is sent to a downstream processing tool for processing. In one embodiment, the processing may include forming interconnects. In one embodiment, the downstream processing includes forming an interconnect layer 1375. The interconnect layer, for example, may be a copper-based alloy, such as copper titanium. Other types of interconnect or metal layers may also be useful. The interconnect, for example, is formed by sputtering, filling the via openings in the dies as well as covering the surface of the mold panel.

Figure 13C:
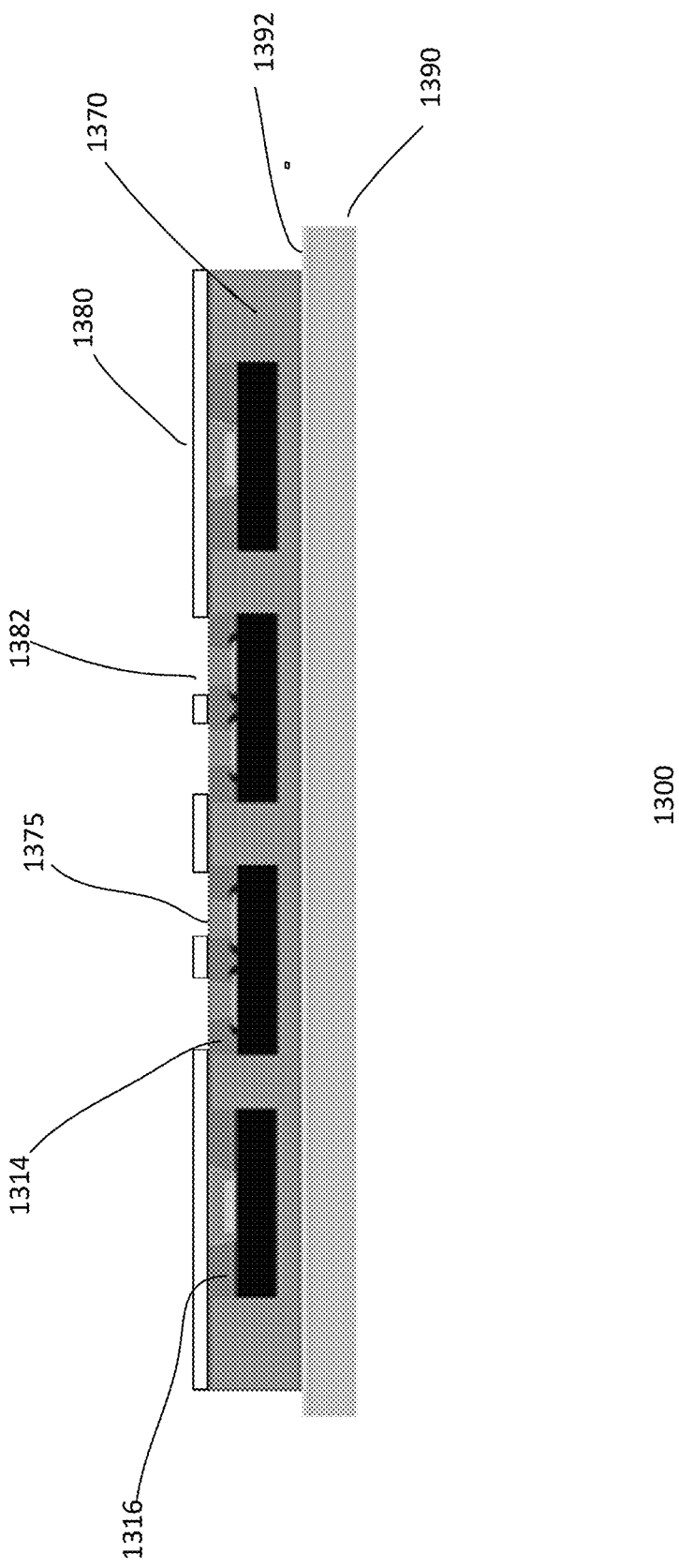

The export DLC file is fed into an laser direct imaging (LDI) system for patterning the dielectric layer. In one embodiment, the DLC file is converted into a circuit file readable by the LDI system. The converted circuit file is used by the LDI system which takes reference from the alignment dies and extracts the DLC data for determining the actual die location for patterning the dielectric layer 1380, so as to form openings 1382 to expose the filled vias, as shown in FIG. 13*c*, forming trace areas for trace interconnects.

Figure 13D:
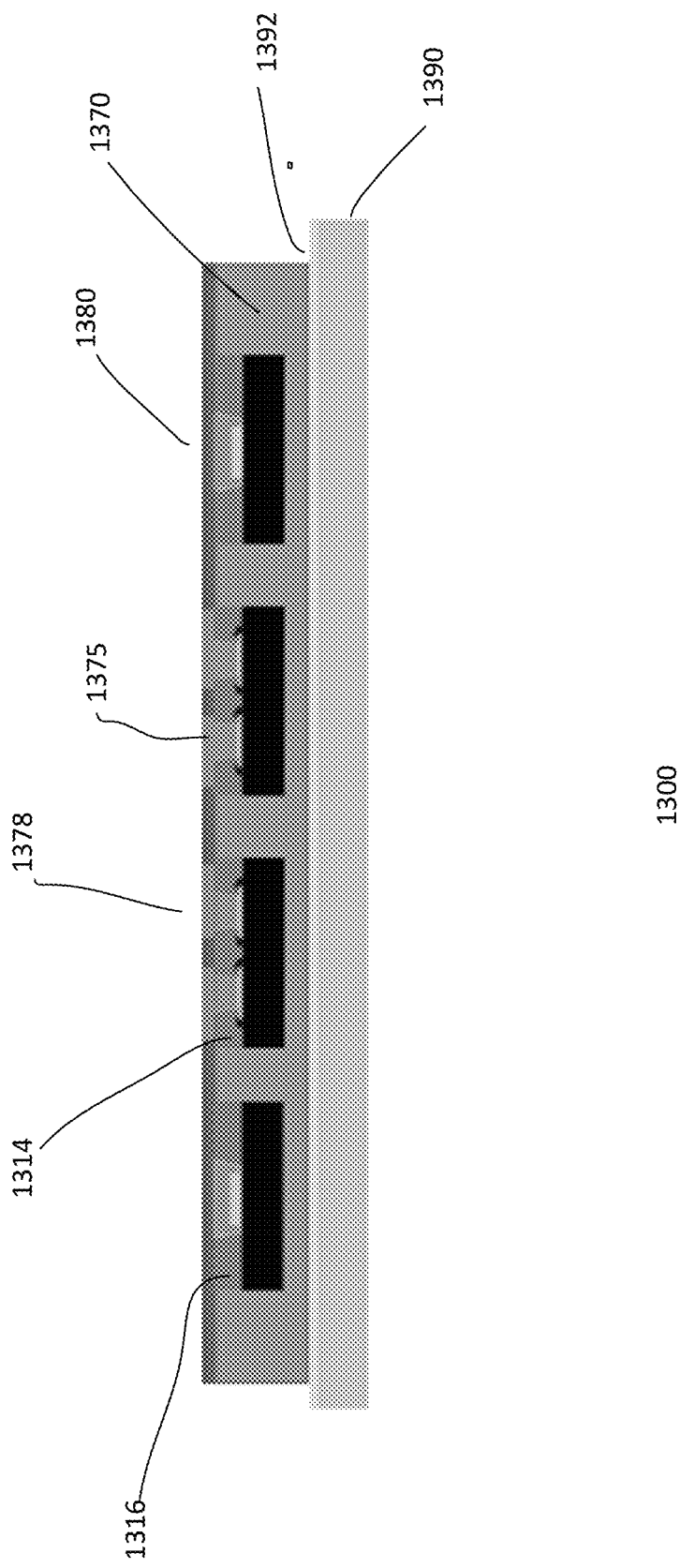
Figure 13E:
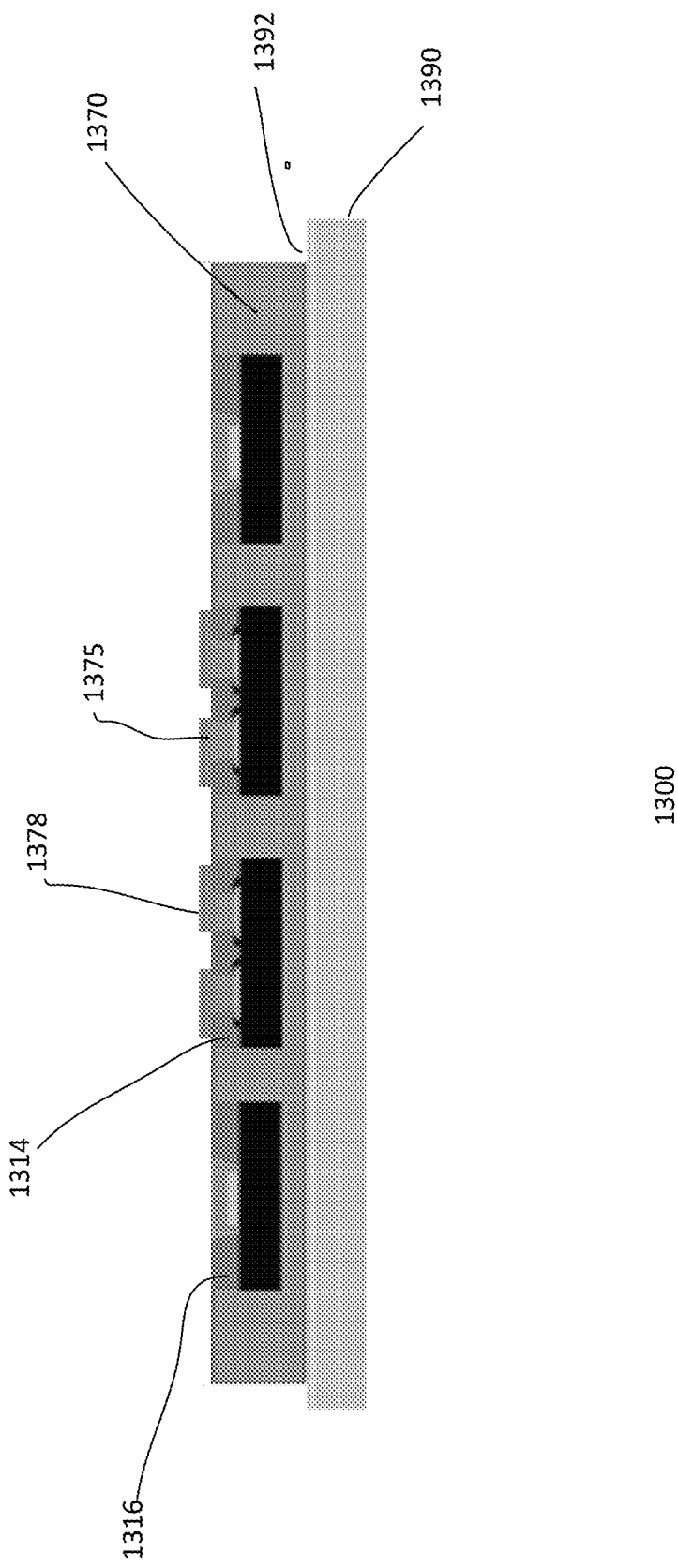

Referring to FIG. 13*d*, the downstream workpiece is subjected to a plating process. For example, a plating process, such as electroplating, forms trace interconnects 1378 in the openings of the dielectric layer. After forming the trace interconnects, the dielectric layer is removed, as shown in FIG. 13*e*. Removal of the dielectric layer may be achieved by, for example, stripping. Other techniques for removing the dielectric layer may also be useful. Subsequent processes may include carrier substrate removal and dicing the panel to singulate the devices.

Figure 14A:
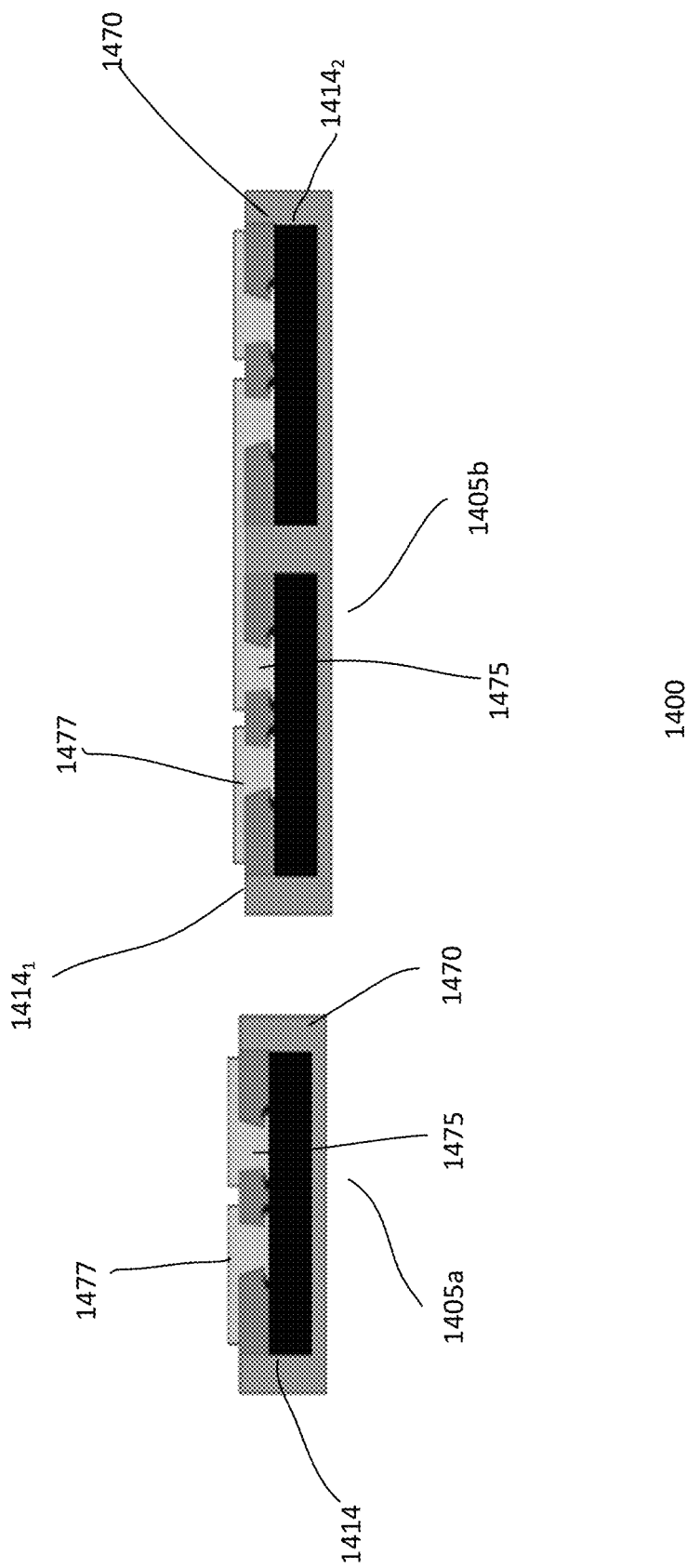
FIGS. 14a-b show simplified side and top views of trace interconnect tolerance with respect to bond contacts of the downstream processing using the alignment carrier with local die alignment marks and alignment dies.
Figure 14B:
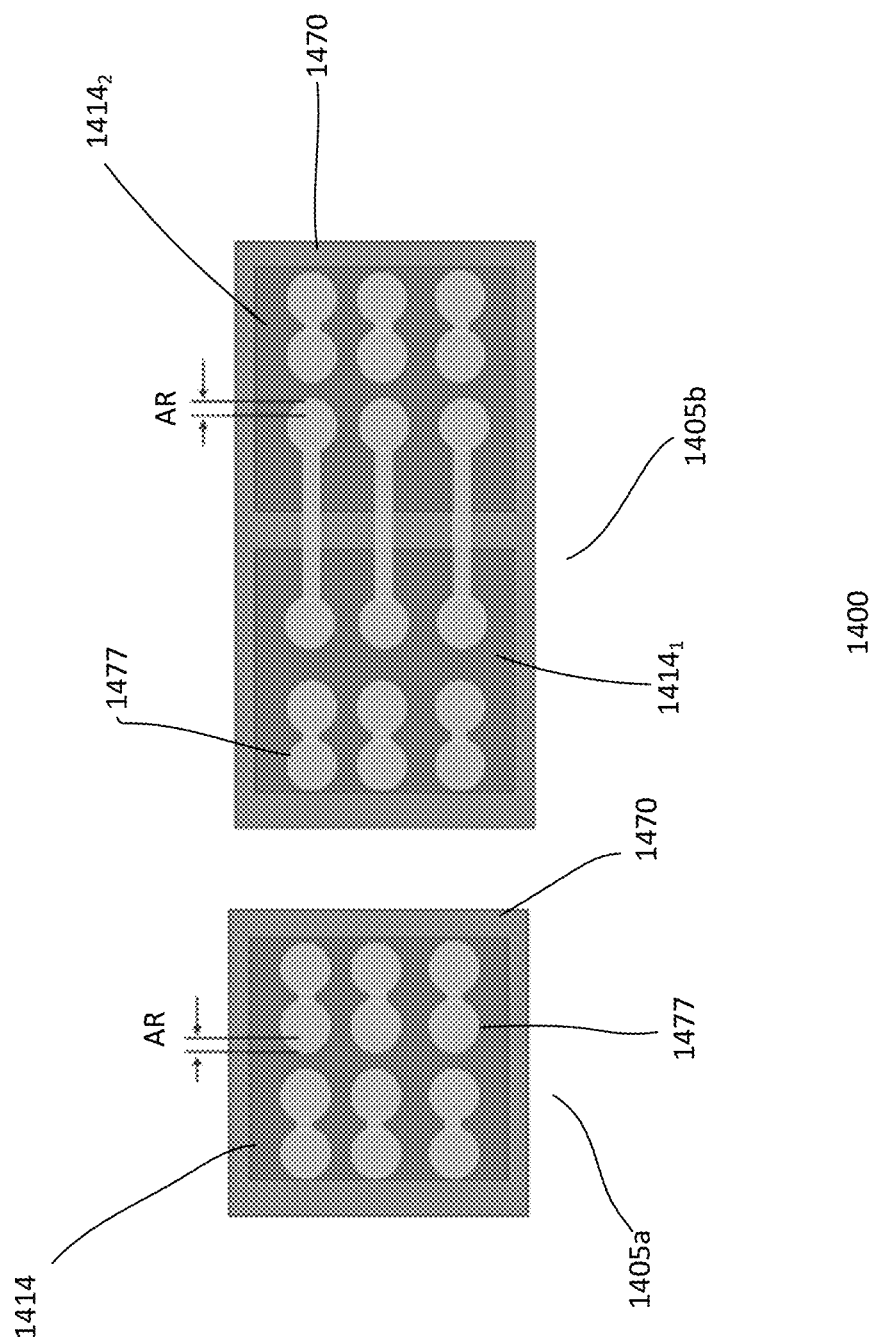

FIGS. 14*a-b* show simplified side and top views 1400 of trace interconnect tolerance with respect to bond contacts of the downstream processing using the alignment panel with local die alignment marks and alignment dies. Referring to FIGS. 14*a-b*, trace interconnects of a single-die configuration 1405*a* and a multiple-die configuration 1405*b* are shown. For example, the single-die configuration shows a die 1414 encapsulated by the mold compound 1470. As for the multiple-die configuration, it exemplarily shows first and second dies 1414$_1$ and 1414$_2$ encapsulated by mold compound 1470. The active surface of the die or dies includes trace interconnects 1477 disposed over the bond contacts 1475 filling bond vias which expose the bond pads. As shown, due to the accurate calculation of the die location based on the use of local die alignment marks on the alignment carrier and alignment dies, downstream processing, such as forming trace interconnects, is more precise. For example, annular ring tolerance (AR) is +/−10 um. Furthermore, the DLC can further enhance annular ring tolerance to less than +/−5 um.

As described, die bonding is performed using an alignment carrier with local alignment marks for improved accuracy. The local alignment marks may also be applicable for wafer level packaging (WLP) processes. For example, local alignment marks may be provided on the dies of a wafer to enhance bonding accuracy.

The present disclosure may be embodied in other specific forms without departing from the spirit or essential characteristics thereof. The foregoing embodiments, therefore, are to be considered in all respects illustrative rather than limiting the invention described herein. The scope of the invention is thus indicated by the appended claims, rather than by the foregoing description, and all changes that come within the meaning and range of equivalency of the claims are intended to be embraced therein.

What is claimed is:

1. An alignment system for a die bonder comprising:
an integrated camera module configured
to view downwards in a vertical direction towards an active surface of an alignment carrier when mounted on the die bonder, the integrated camera module comprising a light source which is configured to emit a light having a wavelength for penetrating through an adhesive layer disposed on the active surface of the alignment carrier to enable the integrated camera module to detect local alignment marks of a die bond region of interest on the active surface of the alignment carrier with die bond regions having local alignment marks, and
to view upwards in the vertical direction for viewing a bottom surface of a die when attached to a bond head of the die bonder for die bonding; and
an alignment controller, wherein the alignment controller is configured to receive input from the camera module, the alignment controller is configured to align the die when attached to the bond head to the die bond region of interest for die bonding based on the input from the camera module in accordance with the local alignment marks of the die bond region of interest.

2. The alignment system of claim 1 wherein the alignment controller is configured to facilitate aligning the bond head in position for die bonding on the die bond region of interest when the die is attached to the bond head, wherein aligning the bond head includes movement horizontally and angularly in a x-y plane based on the input from the camera module.

3. The alignment system of claim 1 wherein
the alignment controller is configured to move the bond head into an alignment position, wherein moving the bond head into the alignment position includes
horizontal movement in x and y directions for coarse alignment of the die when the die is attached to the bond head and
angular movement of the bond head to rotate the die angularly in a x-y plane for fine alignment to a die attach region of the die bond region of interest on the alignment carrier.

4. The alignment system of claim 1 wherein the camera module comprises:
a first camera subunit comprising a first collinear vision camera with a first light source, the first light source serving as the light source configured to emit the light having the wavelength for penetrating through the adhesive layer disposed on the active surface of the alignment carrier, wherein the first camera subunit is configured to view downwards in the vertical direction for detecting the local alignment marks on the alignment carrier; and
a second camera subunit comprising a second collinear vision camera with a second light source, wherein the second camera subunit is configured to view upwards in the vertical direction for viewing the bottom surface of the die when attached to the bond head of the die bonder.

5. The alignment system of claim 4 wherein the second light source is configured to generate a second light having a second wavelength sufficient to penetrate the adhesive layer on the alignment carrier for die bonding to detect the local alignment marks on the alignment carrier.

6. The alignment system of claim 4 wherein the first and second camera subunits are disposed side-by-side along a horizontal x-y plane to reduce a height to reduce a distance traveled by the bond head with the die to the die bond region of interest for die bonding.

7. The alignment system of claim 1, further comprising a gantry assembly configured to position the bond head at successive die bonding regions on the alignment carrier.

8. The alignment system of claim 7, wherein:
the gantry assembly comprises a support alignment assembly; and
the support alignment assembly further comprises an x-axis actuator, a y-axis actuator, an angular (θ) actuator or a combination thereof for aligning the bond head in an x-y plane.

9. The alignment system of claim 1, further comprising a bonding assembly actuator coupled to the bond head for moving the bond head in a z-direction vertically towards or away from the alignment carrier.

10. The alignment system of claim 9, wherein the bond head further comprises a bonding head actuator and a bonding tool, the bonding head actuator is coupled to the bonding assembly actuator for controlling the bonding tool to pick up or release the die.

11. The alignment system of claim 1, wherein the light emitted from the light source has a wavelength of about 600 nm to penetrate the adhesive layer.

12. The alignment system of claim 4, further comprising:
a first reflector coupled to the first light source for reflecting a first light emitted from the first light source to a prism which further reflects the first light downwards to the alignment carrier; and
a second reflector coupled to the second light source for reflecting a second light emitted from the second light source to the prism which further reflects the second light upwards to the die.

13. A method for die bonding comprising:
providing an alignment carrier comprising
die bond regions defined on an active surface of the alignment carrier, and
local alignment marks on the active surface for each die bond region, wherein the local alignment marks facilitate local alignment of bonding to the die bond regions;
mounting the alignment carrier onto a base assembly of a die bonder;
picking up a first die for die bonding onto a first die bond region on the alignment carrier by a bond head of the die bonder;
aligning the first die to the first die bond region according to the local alignment marks of the first die bond region, the aligning the first die to the first die bond region comprising using an alignment system which is configured
to view downwards in a vertical direction for detecting the local alignment marks of the first die bond region, and
to view upwards in the vertical direction for viewing a bottom surface of the first die;
sending information of the alignment system to a controller, wherein the controller aligns the first die to the first die bond region based on the information from the alignment system according to the local alignment marks of the first die bond region; and
moving the first die downwards vertically by the bond head to the alignment carrier after alignment of the first die to the first die bond region is achieved to bond the first die on the first die bond region of the alignment carrier.

14. The method for die bonding of claim 13, further comprising programming the controller to detect the first die bond region to be an alignment die position or a live die position for determining the first die to be an alignment die or a live die.

15. The method for die bonding of claim 13, wherein sending information of the alignment system further comprises sending carrier alignment points in a carrier CAD file and die alignment points in a die CAD file to facilitate alignment.

16. The method for die bonding of claim 15, further comprising matching a die region pattern from the carrier CAD file and a die pattern from the die CAD file.

17. The method for die bonding of claim 13, further comprising:
segmenting the die bond regions on the alignment carrier into at least two blocks;
bonding a plurality of dies to the die bond regions in a selected block of the at least two blocks, wherein bonding the plurality of dies of the selected block comprises
picking up a selected die for die bonding onto a selected die bond region of the selected block,
aligning the selected die to the selected die bond region according to the local alignment marks of the selected die bond region, the aligning the selected die to the selected die bond region comprising using an alignment system which is configured
to view downwards in a vertical direction for detecting the local alignment marks of the selected die bond region, and
to view upwards in the vertical direction for viewing a bottom surface of the selected die,
sending information of the alignment system to the controller, wherein the controller aligns the selected die to the selected die bond region based on the information from the alignment system according to the local alignment marks of the selected die bond region, and
moving the selected die downwards vertically by the bond head to the alignment carrier after alignment of the selected die to the selected die bond region to bond the selected die on the selected die bond region of the selected block,
determining if there are more die bond regions in the selected blocks to bond dies to,
if there are more die bond regions to bond dies to, selecting a next die bond region to be the selected die bond region, and picking up a next die as the selected die, and repeating the aligning the selected die, sending information to the controller and moving the selected die downwards for bonding to the selected die bond region until all die bond regions of the selected block are bonded with dies,
if there are no more dies to bond to the selected block, determining if there are more blocks of the at least two blocks to bond dies to, and if there are, select a next block of the plurality of blocks as the selected block to bond dies to, and repeat bonding the plurality of dies to the selected block until die bonding for all blocks of the at least two blocks are completed.

18. The method for die bonding of claim 17, further comprising determining whether bonding the dies to the die bond regions in a first block is completed before moving the bond head of the die bonder to a second block.

19. The method for die bonding of claim 17, wherein sending information of the alignment system further comprises sending information of the at least two blocks to the controller.

20. The method for die bonding of claim 19, further comprising:

identifying the first block according to the information of the at least two blocks; and identifying a starting die bond region among the die bond regions in the first block for initializing the die bonding.

\* \* \* \* \*